(12) United States Patent
Debow et al.

(10) Patent No.: US 12,264,289 B1
(45) Date of Patent: Apr. 1, 2025

(54) APPARATUS AND METHOD FOR PLASMA COATING SOLID FUELS AND COATED SOLID FUELS PRODUCED USING SAME

(71) Applicant: U.S. Army Combat Capabilities Development Command, Chemical Biological Center, Apg, MD (US)

(72) Inventors: Shaun M. Debow, Edgewood, MD (US); Zachary B Zander, Havre de Grace, MD (US); Patrick J Heaney, Madison, WI (US); Aiping Zeng, Madison, WI (US); Mikhail Y Efremov, Madison, WI (US)

(73) Assignee: The United States of America as Represented by the Secretary of the Army, Washington, DC (US)

( * ) Notice: Subject to any disclaimer, the term of this patent is extended or adjusted under 35 U.S.C. 154(b) by 67 days.

(21) Appl. No.: 18/100,597

(22) Filed: Jan. 24, 2023

Related U.S. Application Data

(60) Provisional application No. 63/303,562, filed on Jan. 27, 2022.

(51) Int. Cl.
| | |
|---|---|
| *C10L 5/32* | (2006.01) |
| *B08B 7/00* | (2006.01) |
| *C23C 16/02* | (2006.01) |
| *C23C 16/26* | (2006.01) |
| *H01J 37/32* | (2006.01) |

(52) U.S. Cl.
CPC .............. *C10L 5/32* (2013.01); *B08B 7/0035* (2013.01); *C23C 16/0227* (2013.01); *C23C 16/26* (2013.01); *H01J 37/3244* (2013.01); *H01J 37/32513* (2013.01); *H01J 37/32541* (2013.01); *H01J 37/32816* (2013.01); *C10L 2200/0204* (2013.01); *C10L 2200/0268* (2013.01); *C10L 2290/20* (2013.01); *C10L 2290/24* (2013.01); *H01J 2237/032* (2013.01); *H01J 2237/1825* (2013.01); *H01J 2237/3323* (2013.01); *H01J 2237/335* (2013.01)

(58) Field of Classification Search
CPC ............. H01J 37/3244; H01J 37/32513; H01J 37/32541; H01J 37/32816; C23C 16/0227; C23C 16/26; B08B 7/0035; C10L 5/32
See application file for complete search history.

(56) References Cited

U.S. PATENT DOCUMENTS

| | | | |
|---|---|---|---|
| 8,526,566 B1 * | 9/2013 | Youchison ............. | G21C 21/02 376/412 |
| 2014/0227548 A1 * | 8/2014 | Myrick ..................... | C10L 1/28 203/40 |

* cited by examiner

*Primary Examiner* — Vishal V Vasisth
(74) *Attorney, Agent, or Firm* — Ulysses John Biffoni

(57) ABSTRACT

Solid fuel pellets or particles are coated with a diamond-like and/or graphitic coating to impart increased resistance to oxidation or other forms of degradation. An apparatus and method for producing solid fuel pellets or particles or other comminuted or particulate material that are coated with diamond-like and/or graphitic coatings employ plasma coating of the particles or comminuted material in a plasma chamber that has provision for agitating and/or stirring the particles during the plasma coating process. The gas feed to the plasma chamber may contain at least one organic carbon source.

13 Claims, 21 Drawing Sheets

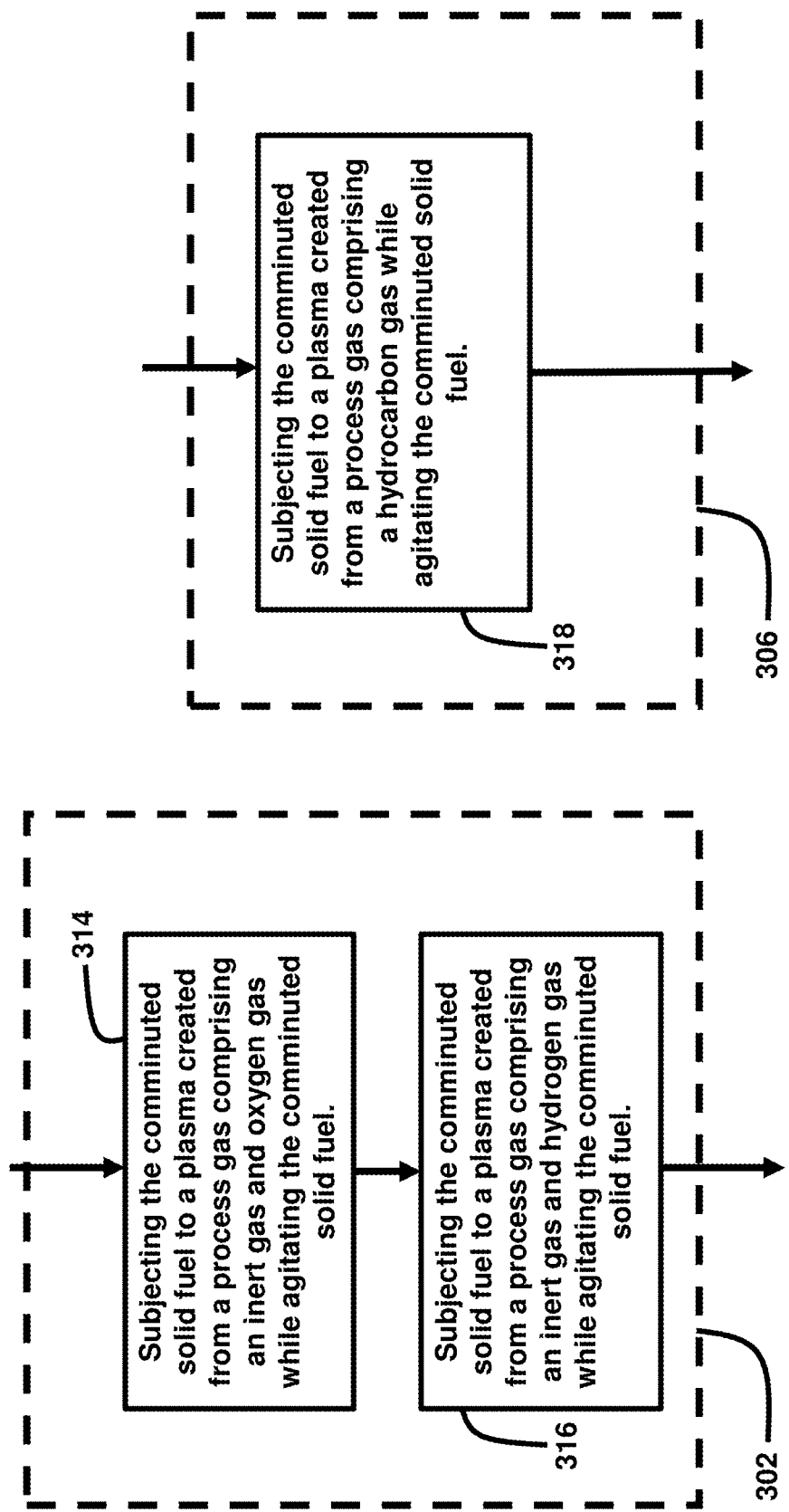

APPARATUS AND METHOD FOR PLASMA COATING SOLID FUELS AND COATED SOLID FUELS PRODUCED USING SAME

CROSS-REFERENCE TO RELATED APPLICATIONS

This application claims the benefit of the priority of United States Provisional Application for Patent Ser. No. 63/303,562, filed on Jan. 27, 2022, which is incorporated by reference herein in its entirety.

GOVERNMENT INTEREST

The embodiments herein may be manufactured, used, and/or licensed by or for the United States Government without the payment of royalties thereon.

BACKGROUND

Technical Field

The embodiments herein generally relate to plasma coating of comminuted material and in particular, to plasma coating of solid fuel pellets or particles.

Description of the Related Art

Historically, red phosphorus (RP) and other solid fuels have found both military and commercial applications. These compositions are subject to environmental degradation processes which can cause undesired effects. RP, for example, can degrade in the presence of water to form hazardous phosphine gas. This is detrimental to those who work with RP as they are forced to wear burdensome personal protective equipment when concentrations of phosphine exceed regulatory levels or when levels are unknown. Phosphine is also known to have deleterious effects on many metals and electronics. Existing strategies to incorporate organic polymers to encapsulate RP adversely affect target thermodynamics, burn rates and add unnecessary weight and bulk thereby reducing performance. The desirable properties of RP or some solid fuels can be greatly degraded through the application of organic polymers and encapsulants. In the case of military operations, this polymer encapsulant requires additional energy and oxidative material to initiate the fuel or continue burning, in the case of RP to produce smoke for obscuration. In the case of commercial applications, the polymer coatings currently applied to RP (used as a flame retardant in plastics) typically result in a waste stream that may contain hazardous materials and have adverse environmental and health effects, and associated disposal costs.

The need remains for an effective coating process that can eliminate potentially hazardous waste streams, reduce potential health effects, and reduce the hazardous material disposal costs that are associated with the aforementioned polymer coatings. Additionally, uniformity and low-defect density have typically been difficult to achieve with the aforementioned polymer coatings. Accordingly, the need remains for a coating process that provides a near-continuous, even coating of comminuted materials such as, for example, solid fuel pellets.

SUMMARY

In view of the foregoing, the embodiments herein have successfully demonstrated the application of one or more of diamond-like carbon (DLC), graphitic carbon, amorphous or tetrahedral carbon, hydrogenated or non-hydrogenated carbon, and other $sp^2$ and $sp^3$ hybridized carbon existing in metastable phases to apply a thin, conformal coating to fully encapsulate or cover surfaces of red phosphorus and other solid fuels (examples include but are not limited to metals: e.g. Mg, Al, Fe; metal hydrides: $TiH_2$, $ZrH_2$, Decaborane, $AlH_3$; non-metals: Si, C, S; and, organic: sugars, benzoates, salicylates, hexamine, anthracene, naphthalene) for protection against oxidative, reductive, hydrolytic, and other damage, and to improve the free-flow of encapsulated materials. These coatings may be applied to a variety of materials of different sizes, from nano to macro scales and to a variety of shapes, ranging from spheres, 2-dimensional sheets, flakes, rods, granules having complex morphologies, et cetera. Unless otherwise specified, the term "DLC coating" as used herein shall be understood to refer to a coating comprising one or more coating layers having the same or varying compositions and wherein each of the coating layers comprises one or more of diamond-like carbon, graphitic carbon, amorphous or tetrahedral carbon, hydrogenated or non-hydrogenated carbon, and other $sp^2$ and $sp^3$ hybridized carbon existing in metastable phases. Unless otherwise specified, the term "DLC coatings" as used herein, aside from being the plural form of DLC coating, may be used as a generic reference for the class or group having as members the various coatings that meet the definition of DLC coating set forth above. Unless otherwise specified, the term "DLC coating" as used herein in the process context may refer to the process of depositing a DLC coating or DLC coatings.

Application of these coatings to particles and structures has been successfully achieved by the embodiments disclosed herein through the use of near-vacuum plasma deposition processes using hydrocarbon gases. Coatings are formed at low pressures using carbon-containing gases, that may include but are not limited to methane ($CH_4$), acetylene ($C_2H_2$), other saturated and unsaturated hydrocarbon gases, as well as gases containing other elements (oxygen, nitrogen, fluorine, chlorine, boron, silicon, etc.). Some commercial examples of gases containing other elements include: 1,1,1,2-tetrafluoroethane (HFC-134a, contains fluorine), tetrafluoroethylene (contains fluorine), hexamethyldisiloxane (HMDSO, contains silicon and oxygen), chloromethane (R-40, contains chlorine), and triethyl borate (contains boron and oxygen). The gas atmosphere may include additional gases, both chemically active in plasma conditions (hydrogen, nitrogen) and inert gases (argon), as additional means for adjusting the composition and physical properties of the coatings. The particular surface and/or presence of contaminants may impact formation of these coatings and may require cleaning to remove oxidation or other interfering species or residues (moisture, adsorbed carbon dioxide, surfactants, oils, etc.) on or near the surface. The cleaning may be achieved by plasma treatment with oxidative (e.g. oxygen) environments, reductive environments (e.g. hydrogen) and/or similar techniques.

The embodiments herein provide processes that do not involve any liquid-phase solvents and do not introduce any environmental contaminants or health hazards, which would need to be removed before use. Many existing coating processes have intermediary chemicals which can be harmful or may need to be removed and treated before disposal.

The embodiments disclosed herein are environmentally-friendly and allow for easy manipulation of surface conditions to balance coating thicknesses versus weight additions. The embodiments herein can be scaled from grams to kilogram quantities while overcoming material incompatibility issues present in traditional solutions.

The embodiments herein provide an improved coating process for forming DLC coatings that can eliminate potentially hazardous waste streams, reduce potential deleterious health effects, and eliminate the hazardous waste disposal costs associated with the polymer encapsulant coatings mentioned previously. In addition, the embodiments herein provide DLC coatings that are near-continuous, even, and low in defects.

These and other aspects of the embodiments herein will be better appreciated and understood when considered in conjunction with the following description and the accompanying drawings. It should be understood, however, that the following descriptions, while indicating exemplary embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which:

FIGS. 3-5 are flow diagrams illustrating processes for plasma treatment of comminuted material in accordance with some of the embodiments disclosed herein;

DETAILED DESCRIPTION

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

Figure 1:
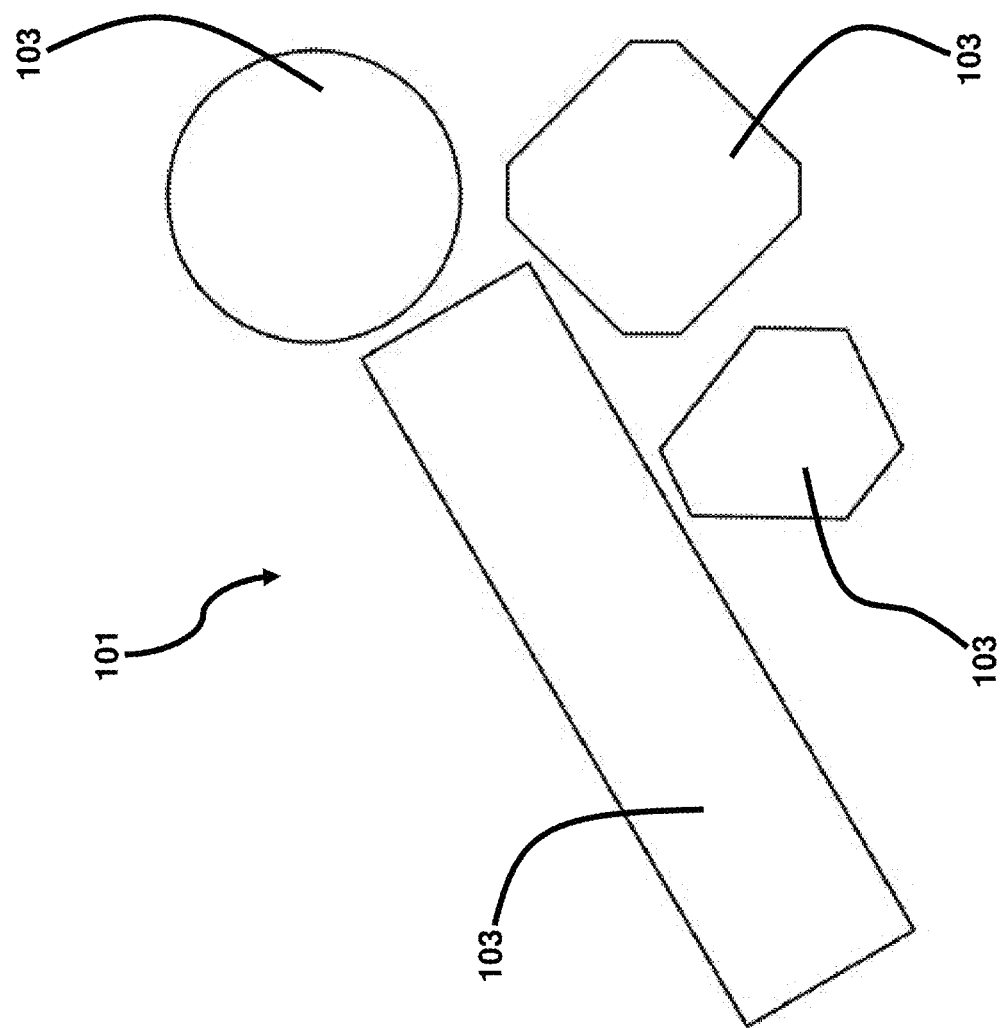
FIG. 1 is a diagrammatic depiction of comminuted material that can be treated by the embodiments disclosed herein.
Figure 2:
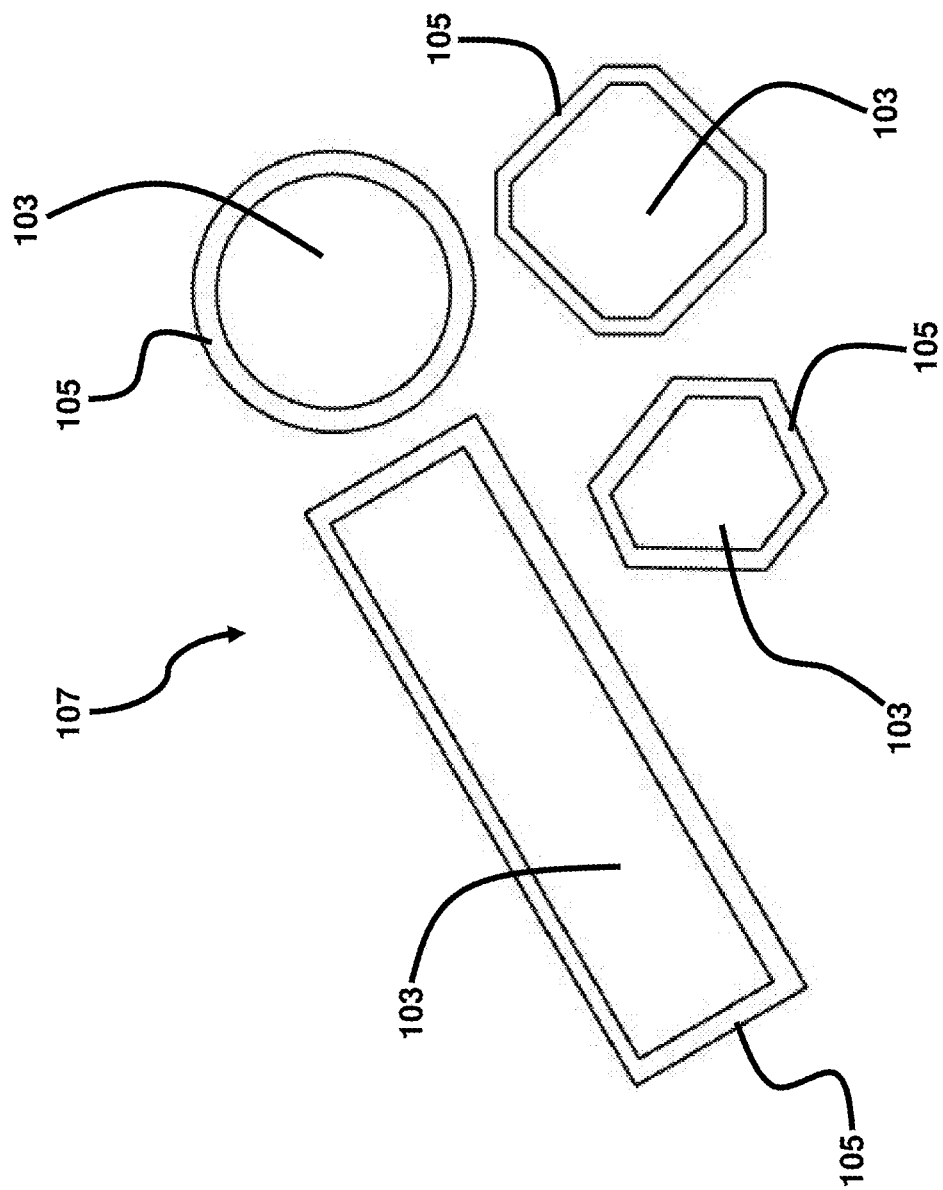
FIG. 2 is a diagrammatic depiction of comminuted material that has been coated using some of the embodiments disclosed herein.

Referring to FIGS. 1-2, some embodiments herein are directed to compositions of matter comprising a solid fuel 103 coated with a coating 105, which may be a DLC coating or may include one or more DLC coatings. The solid fuel 103 has a surface, and the coating material 105 coats at least a portion of the surface of the solid fuel 103. In some embodiments, the coating material 105 includes one or more networks selected from one or more rigid amorphous networks and one or more crystalline networks. Each of the rigid amorphous networks and crystalline networks may include one or more of sp$^3$ and sp$^2$ hybridized carbon atoms. The rigid amorphous networks and the crystalline networks may be in a thermodynamically metastable phase.

The solid fuel is in comminuted form 101 and includes a plurality of particles 103, and the coating material 105 encapsulates each of the particles 103. The terms "encapsulate," "coat," or "cover" as used herein mean that the surface of each particle or substrate is covered to such extent and to such thickness that the benefits of the coating are imparted to the particles or substrate to such a degree as to be of practical value, and these terms encompass coatings that may include defects such as, without limitation, pinholes or uncovered areas of the particle or substrate surface. Each of the solid fuel particles or pellets 103 forms the core of the respective one of the coated particles or pellets 107. As used herein, the term "pellet" refers to the larger particles of the macro size scale.

In some embodiments herein, the solid fuel 103 may include one or more solid fuels that are metals. Some examples of metals suitable for use as the solid fuel are metallic elements or compositions that include, without limitation, one or more metals selected from the group consisting of Mg, Al, and Fe.

In some embodiments herein, the solid fuel 103 may include one or more metal hydrides. Some examples of metal hydrides suitable for use as the solid fuel are metal hydrides that include one or more of $TiH_2$, $ZrH_2$, decaborane, and $AlH_3$.

In some embodiments herein, the solid fuel 103 may include one or more non-metals. Some examples of non-metals suitable for use as the solid fuel are non-metals that include one or more of red phosphorus (RP), Si, C, and S. In some examples, the solid fuel is RP.

In some embodiments herein, the solid fuel 103 may include one or more organic compositions. The term "composition" as used herein is to be construed broadly as encompassing, without limitation, elemental materials, alloys, compounds, mixtures, and solutions. Some examples of organic compositions suitable for use as the solid fuel are organic compositions that include one or more of sugars, benzoates, salicylates, hexamine, anthracene, naphthalene.

Some embodiments herein are directed to compositions of matter that include a comminuted material including particles 103 made of a solid fuel that are coated by a coating 105 formed by a plasma coating process. The particles are coated by a coating formed by a plasma coating process that includes subjecting the comminuted material to a plasma created from a process gas comprising at least one hydrocarbon gas while agitating the comminuted material.

Figure 3:
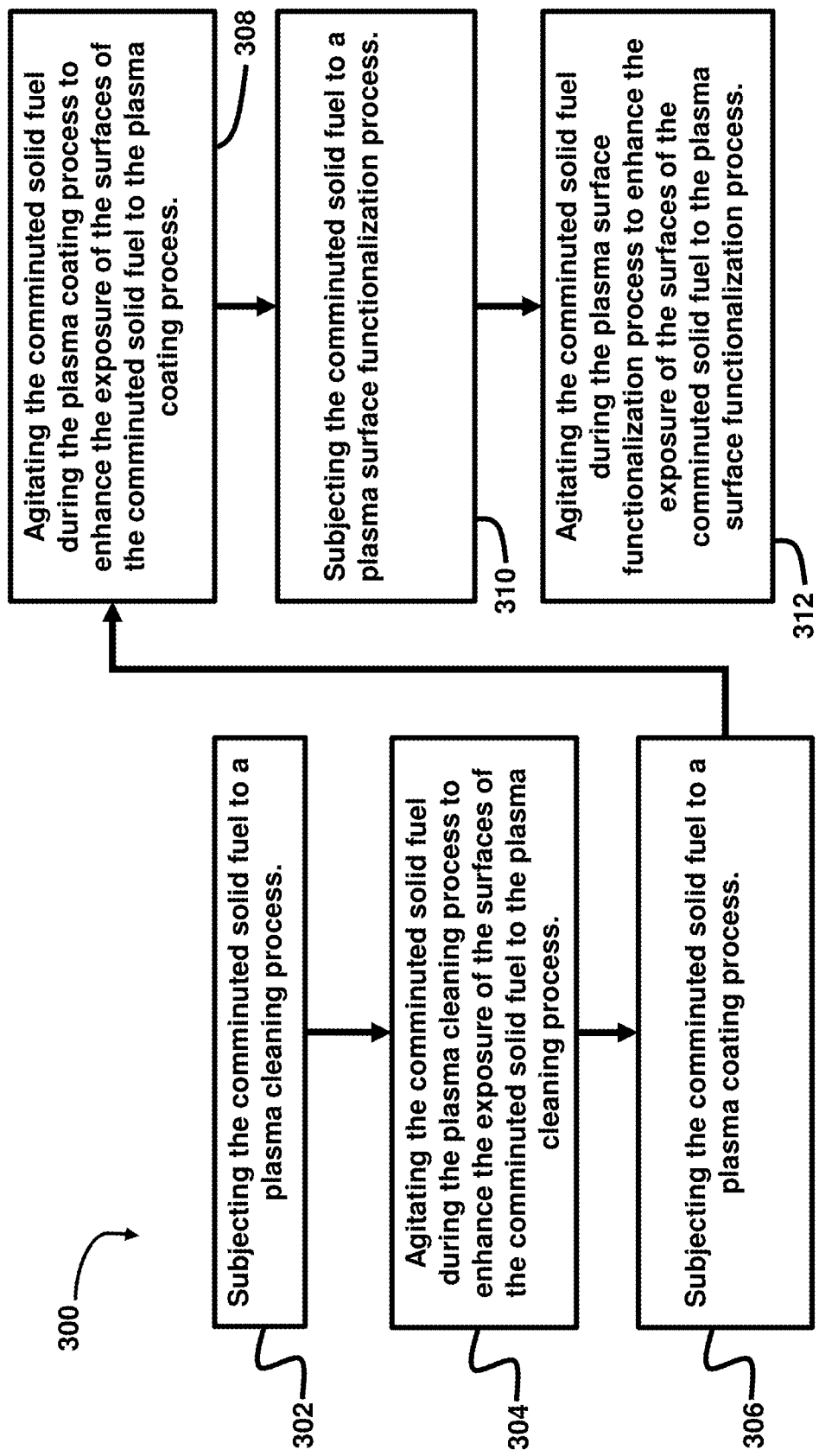

Further referring to FIGS. 3-5, some embodiments herein are directed to methods, for example the method 300, for the application of a coating 105 that may be a DLC coating or that may include one or more DLC coatings to a comminuted solid fuel 103. The method includes subjecting (302) the comminuted solid fuel to a plasma cleaning process, agitating (304) the comminuted solid fuel during the plasma cleaning process to enhance the exposure of the surfaces of the comminuted solid fuel to the plasma cleaning process, subjecting (306) the comminuted solid fuel to a plasma coating process to coat the comminuted solid fuel with one or more DLC coatings, and agitating (308) the comminuted solid fuel during the plasma coating process to enhance the exposure of the surfaces of the comminuted solid fuel to the plasma coating process.

In some embodiments, the subjecting (302) of the comminuted solid fuel to a plasma cleaning process may include subjecting (316) the comminuted solid fuel to a plasma created from a process gas comprising an inert gas and hydrogen gas while agitating the comminuted solid fuel. In some embodiments, the subjecting (306) of the comminuted solid fuel to a plasma coating process may include subjecting (318) the comminuted solid fuel to a plasma created from a process gas comprising a hydrocarbon gas while agitating the comminuted solid fuel.

In some embodiments, the solid fuel 103 may include one or more solid fuels selected from the group consisting of metals, metal hydrides, non-metals, and organic compositions. In some embodiments, the solid fuel 103 may include one or more solid fuels selected from the group consisting of Mg, metal hydrides, non-metals, and organic compositions.

Further referring to FIGS. 6-10, some embodiments herein are directed to a plasma apparatus 100 for plasma treatment of a comminuted material. The plasma apparatus includes a vacuum chamber 102, a plasma chamber 104, a motor 106, a process gas supply conduit 108, and an electrical power supply 110.

The vacuum chamber 102 has an interior 112 and an exterior 114. The interior of the vacuum chamber 102 is sealed from an environment surrounding the exterior of the vacuum chamber 102 so as to maintain pressures below atmospheric pressure within the vacuum chamber 102 without the ingress of any ambient air or other gases from the exterior of the vacuum chamber 102 into the interior of the vacuum chamber 102.

The plasma chamber 104 is provided inside the vacuum chamber 102. The plasma chamber 104 has an interior 116 and an exterior 118. The plasma chamber 104 is rotationally supported inside the vacuum chamber 102 by electrically insulating supports such that the plasma chamber 104 can be rotated about an axis of rotation 124. In some embodiments herein, the electrically insulating supports may be provided by insulating journal bearings 120 in possible cooperation with another set of insulating journal bearings (not shown) on the other side of the plasma chamber 104 or in possible cooperation with the sealing member 408. The plasma chamber 104 is made of an electrically conductive material. The motor 106 is operably linked to the plasma chamber 104 such that the motor 106 can impart rotation to the plasma chamber 104 when the motor 106 is energized.

The process gas supply conduit 108 is in fluid communication with the plasma chamber 104 such that the process gas can enter the plasma chamber 104 without interfering with the rotation of the plasma chamber 104 and such that the vacuum chamber 102 and the plasma chamber 104 remain sealed from the environment surrounding the exterior of the vacuum chamber 102. The process gas for treating the comminuted material is supplied to the plasma chamber 104 through the process gas supply conduit 108.

The electrical power supply 110 is configured to supply a current to the plasma chamber 104 to generate an electromagnetic field inside the plasma chamber 104 of sufficient power to at least in part ionize the process gas within the plasma chamber 104 to create a plasma within the plasma chamber 104 when the plasma apparatus is in operation, such that the plasma chamber 104 serves as a hollow electrode configured to generate the plasma. In some embodiments, this configuration allows the apparatus to take advantage of the "hollow cathode effect."

In the illustrated embodiment, the plasma chamber 104 is vented to the interior of the vacuum chamber 102 through a vent 126, which may be provided in one end portion of the plasma chamber 104. The process gas supply conduit 108 enters the plasma chamber 104 and extends into the plasma chamber 104. The process gas supply conduit 108 has an interior end 113 that is located in the interior of the plasma chamber 104 and the process gas enters the plasma chamber 104 through the interior end of the process gas supply conduit 108. Accordingly, the interior end of the process gas supply conduit 108 provides an entrance to the plasma chamber 104 for the process gas. The vent 126 in the one end portion of the plasma chamber 104 is provided at a location spaced some distance apart from the location of the entrance to the plasma chamber 104 for the process gas such that the process gas or the plasma traverses a majority of a length of the plasma chamber 104 before the process gas or the plasma is vented out of the plasma chamber 104. In the illustrated embodiment, the vent 126 in the one end portion of the plasma chamber 104 is located some distance apart from the interior end 113 of the process gas supply conduit 108.

In some embodiments disclosed herein, an additional agitating means in addition to the rotating plasma chamber may be used. The additional agitating means may comprise one or more items selected from the group consisting of, mesh screens and/or partitions, caged balls, fingers, fins or ribs, vanes, blades, propellers, augers, and paddles.

Figure 7:
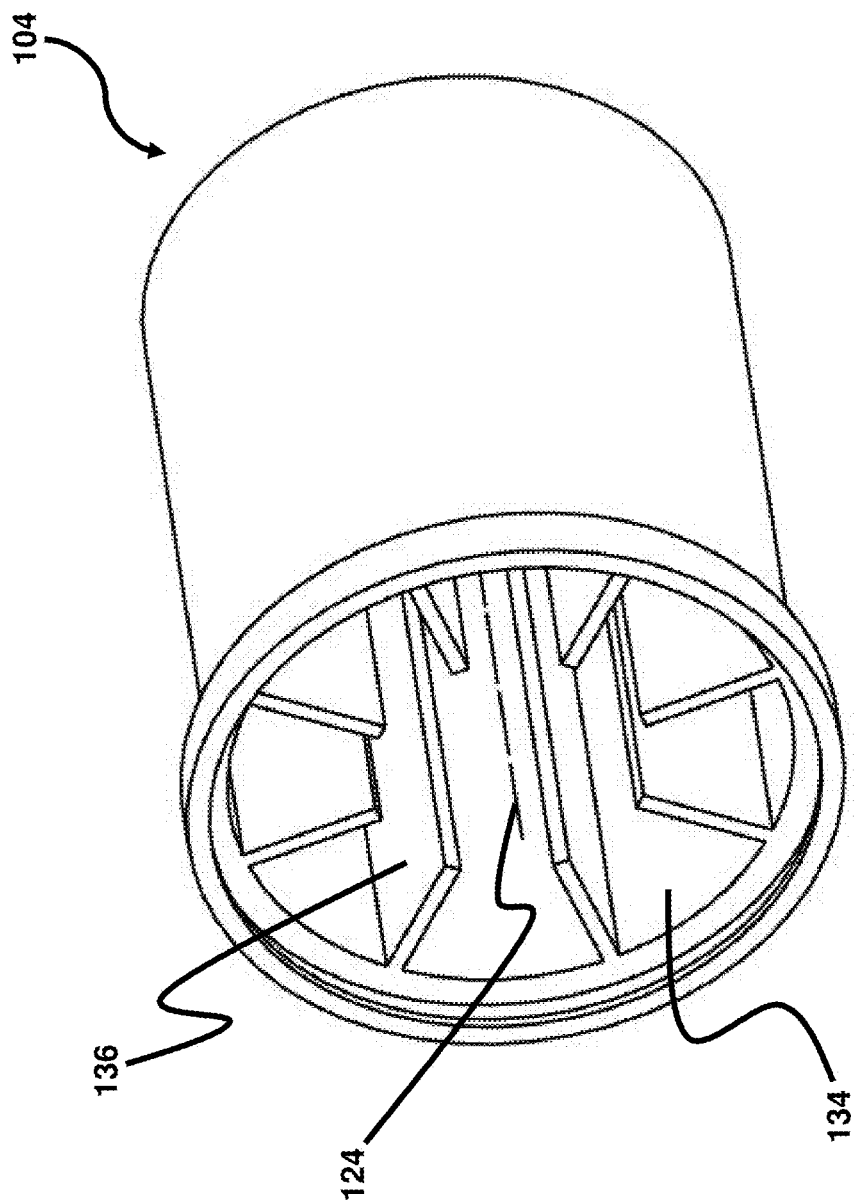
FIG. 7 is an isometric view illustrating an embodiment of a plasma chamber in accordance with some of the embodiments disclosed herein that employs internal fins for enhanced agitation.

Referring to FIG. 7, a plasma chamber 104 of a plasma apparatus in accordance with an embodiment herein can be seen. The plasma chamber 104 has a wall 134 surrounding the axis of rotation 124, and the additional agitating means comprises a plurality of fins or ribs 136, which are also occasionally referred to herein as fingers, attached to the wall 134. The fins 136 project inward from the wall 134 toward the axis of rotation 124. The fins 136 rotate with the plasma chamber 104, and the fins 136 have an axial extent such they extend in an axial direction parallel to the axis of rotation for at least some distance. In the illustrated embodiment, the fins 136 extend in an axial direction parallel to the axis of rotation of the plasma chamber 104 for approximately the entire length of the interior of the plasma chamber 104. The fins or ribs 136 improve homogeneity and particle distribution within the tank and thus provide for more uniform coating of the particles.

Figure 8:
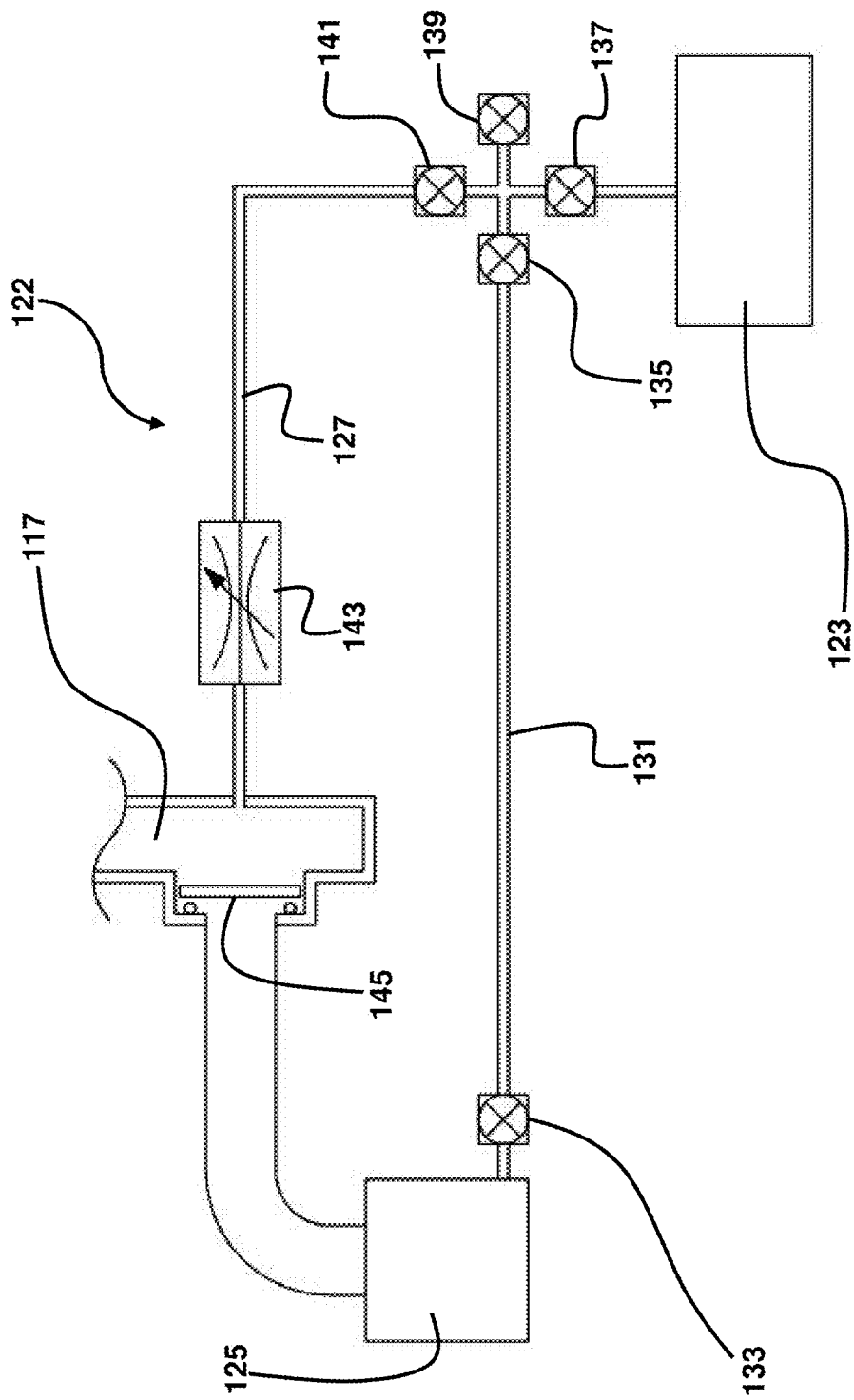
FIG. 8 is an enlarged view illustrating a schematic diagram of the vacuum system for use with some of the embodiments disclosed herein.

Referring to FIG. 8, the apparatus 100 also includes a vacuum system 122 configured to create a vacuum in the vacuum chamber 102 and in the plasma chamber 104. As used herein, the term "vacuum" refers to pressures below atmospheric pressure. The vacuum system 122 is capable of creating and maintaining pressures as low as about 1 milli-Torr or less. The vacuum system 122 includes the vacuum chamber 102, which may be made of stainless steel. The vacuum system 122 includes a mechanical roughing pump 123 and a turbo-molecular pump 125. The roughing pump is initially engaged via the chamber-to-rough pump line 127 to reduce the pressure in the vacuum chamber 102 to reduce the burden on the turbo pump. Gas is evacuated from the vacuum chamber 102 through the vacuum chamber outlet 117 at least when reducing the pressure in the vacuum chamber 102. Once the pressure in the vacuum chamber 102 is reduced by the roughing pump 123, then the turbo pump 125 is engaged to achieve the very low pressures needed for the plasma treatment processes. The roughing pump may continue to evacuate the exhaust of the turbo-molecular pump via the turbo-to-rough line 131.

The vacuum system 122 also includes the valves 133, 135, 137, 139, 141, the throttle valve 143, and the gate valve 145; some valves 133 and 135 may be present for convenience. The gate valve 145 allows fluid communication between the turbo-molecular pump 125 and the vacuum chamber 102 when the turbo-molecular pump 125 is in operation and the gate valve 145 is open to achieve very low pressures. When the gate valve 145 is closed, the gate valve 145 protects the turbo-molecular pump 125 from the atmospheric pressure when the vacuum chamber 102 is being vented to the atmosphere. The throttle valve 143, provided in the chamber-to-rough pump line 127, allows adjustment of the pressure in the vacuum chamber 102 and in turn in the plasma chamber 104. The valve 133 selectively engages the turbo-molecular pump 125 with the turbo-to-rough line 131. The valve 135 selectively engages the mechanical roughing pump 123 with the turbo-to-rough line 131. The valve 137 selectively engages the mechanical roughing pump 123 with the other components of the vacuum system 122. The valve 139 allows the vacuum chamber 102 to be vented to the atmosphere at the end of the plasma treatment process for removing the treated comminuted material from the plasma chamber 102. The valve 141 selectively engages the mechanical roughing pump 123 with the chamber-to-rough pump line 127.

Figure 9:
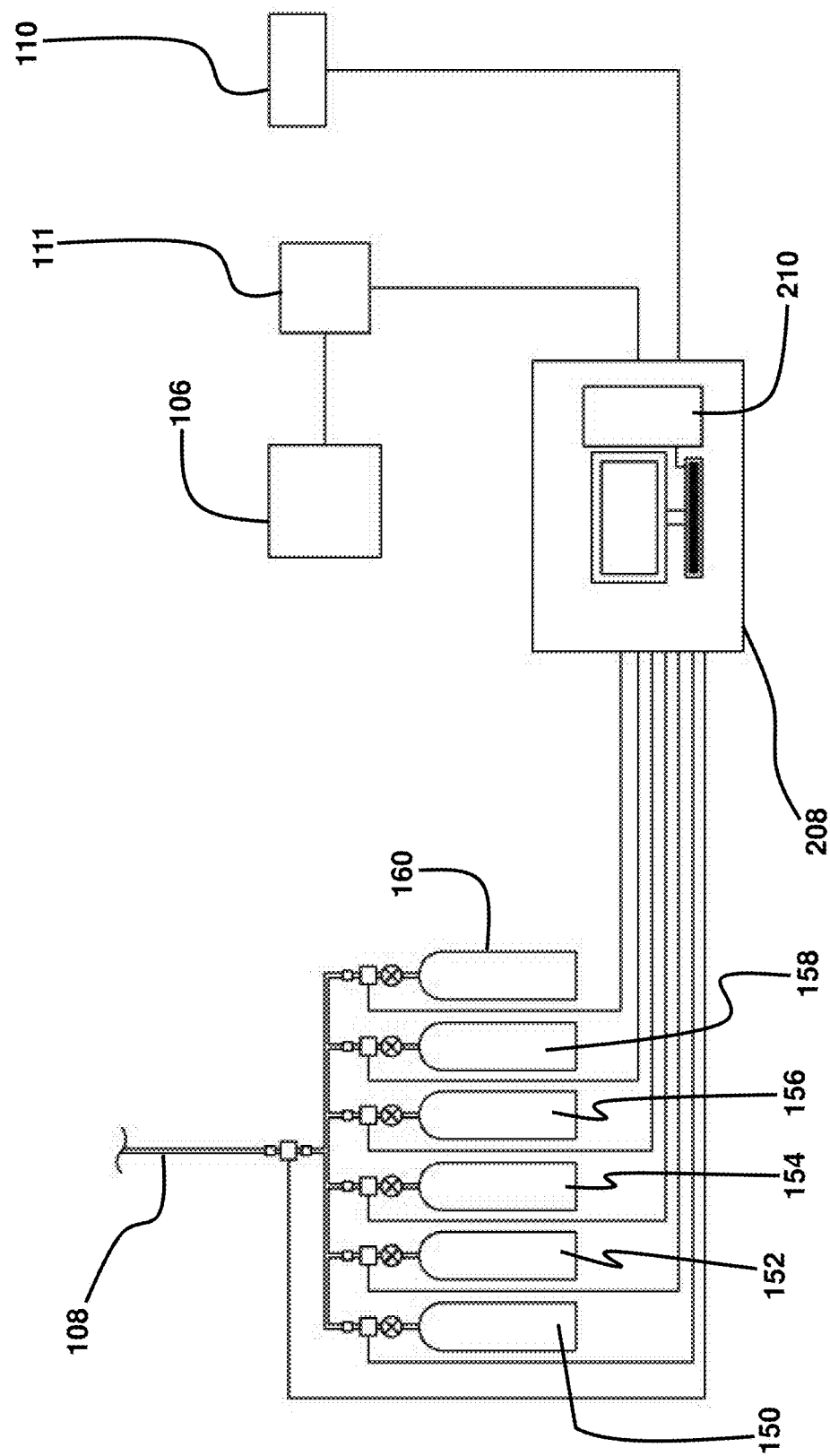
FIGS. 9-10 are schematic diagrams illustrating a gas supply system for use with some of the embodiments disclosed herein.
Figure 10:
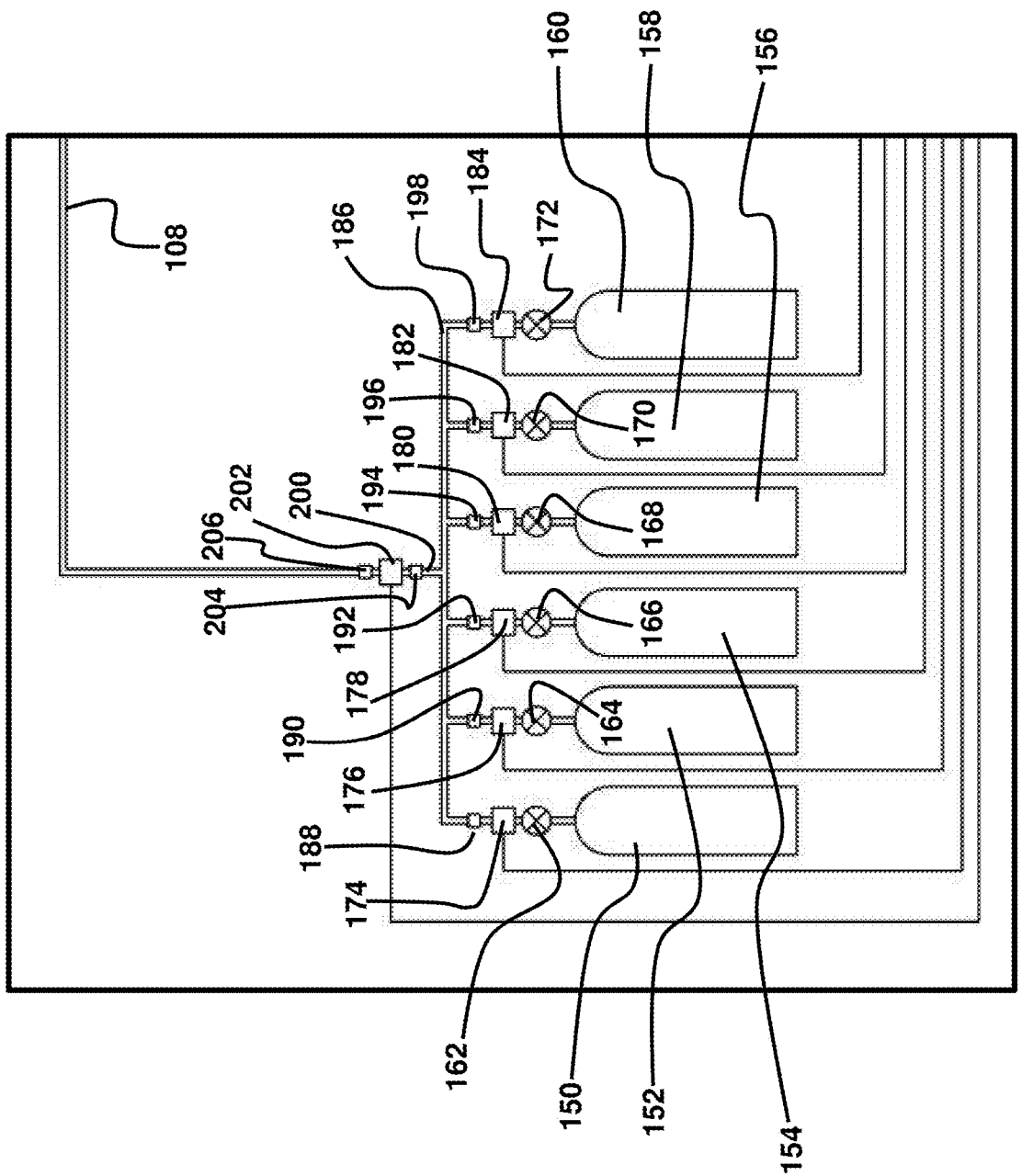
Figure 11:
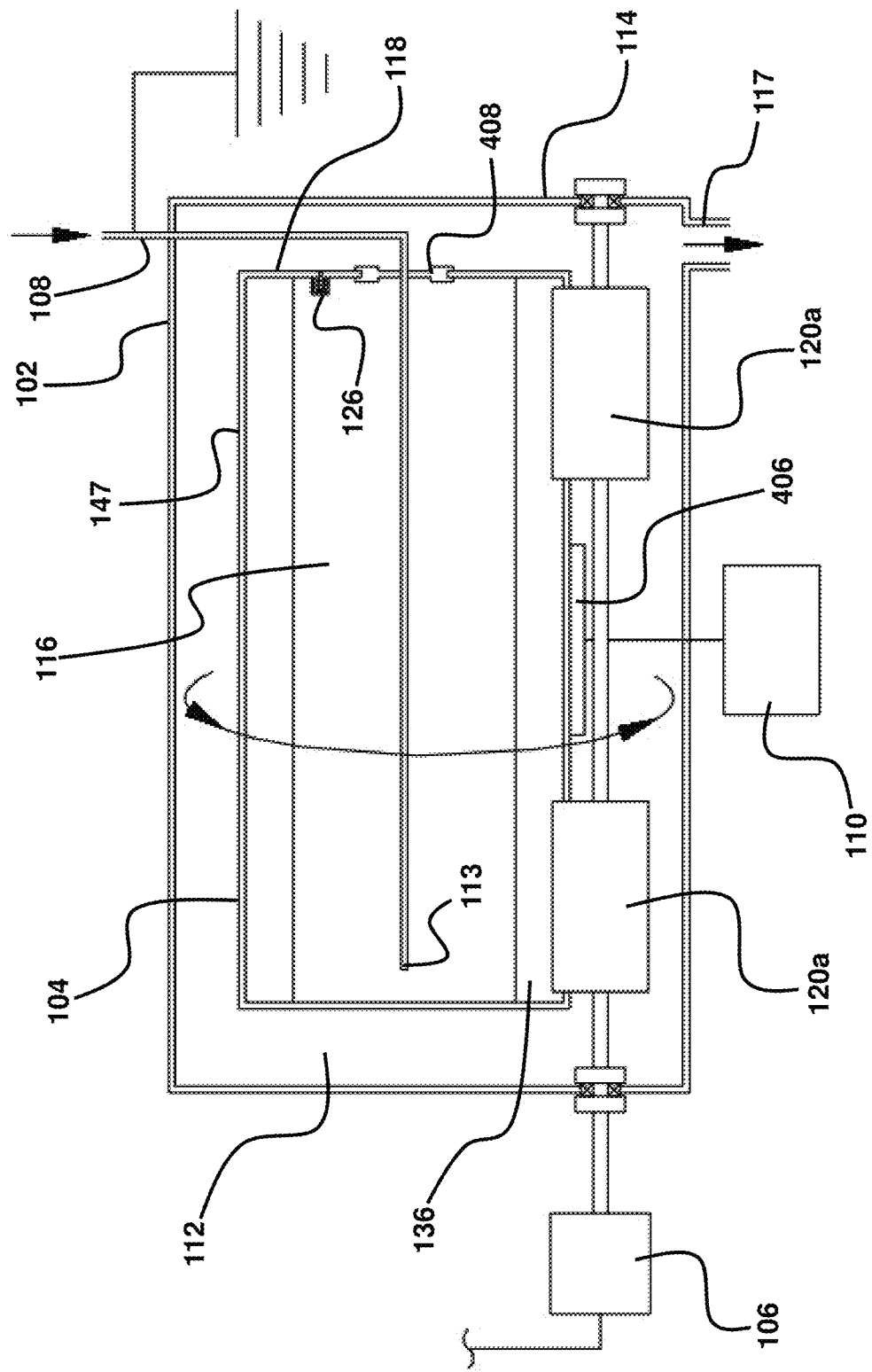
FIGS. 11-12 are schematic diagrams illustrating a second example of a plasma apparatus in accordance with some of the embodiments disclosed herein.

In the illustrated example of FIGS. 9-11, the vacuum chamber 102 is sealed from the atmosphere such that the vacuum chamber 102 can be evacuated to pressures below atmospheric pressure. Accordingly, the pressure inside the plasma chamber 104, which is located inside the vacuum chamber 102, may also be reduced to and/or maintained at pressures below atmospheric pressure. In some embodiments herein the vacuum chamber 102 and the plasma chamber 104 are made of stainless steel. The vacuum system 122 includes vacuum pumps 123 and 125 and downstream pressure control provided by valves 133, 135, 137, 139, 141, the throttle valve 143, the gate valve 145, and associated piping (e.g. 127 and 131). The vacuum system 122 cooperates with the gas delivery system, which includes tanks 150, 152, 154, 156, 158, and 160 and flow controllers 174, 176, 178, 180, 182, and 184, and the automated control system 208 to provide for control of the pressure inside the vacuum chamber 102.

In some of the embodiments disclosed herein, one or more mixtures of gases may be used as the process gas, each mixture being used for a corresponding type of plasma treatment. Using the plasma apparatus 100 as an example, it can be seen that the plasma apparatus 100 further includes a plurality of gas storage tanks 150, 152, 154, 156, 158, and 160. The plurality of gas storage tanks at least include one corresponding gas storage tank for each of the gases used in the mixtures of gases used in the various plasma treatments that are to be applied to a batch of comminuted material. Each of the plurality of gas storage tanks has at least one outlet 162, 164, 166, 168, 170, and 172, which may also serve for filling each gas storage tank.

Some embodiments herein, may also include a plurality of gas flow controllers 174, 176, 178, 180, 182, and 184. Each of the plurality of gas flow controllers is provided at the outlet of a corresponding one of the plurality of gas storage tanks. Each of the plurality of gas flow controllers controls a flow of a corresponding one of the gases used in the mixtures of gases out of the corresponding one of plurality of gas storage tanks. In an example of the embodiments disclosed herein, the MKS-GE50A flow controller is used for the gas flow controllers 174, 176, 178, 180, 182, and 184.

Some embodiments herein may further include a manifold 186 having a plurality of inlets 188, 190, 192, 194, 196, and 198 and one outlet 200. The flow of each of the gases from the outlet of the corresponding one of the plurality of gas storage tanks is conducted, through the corresponding one of the plurality of gas flow controllers, to a corresponding one of the plurality of inlets of the manifold 186. Each of the plurality of gas flow controllers is in fluid communication with a corresponding one of the plurality of inlets of the manifold 186. One or more gases received at the inlets of the manifold 186 are conducted to the outlet of the manifold as a mixture of gases that constitutes the process gas for the corresponding type of plasma treatment.

A process gas flow controller 202 has an inlet 204 and an outlet 206. In some embodiments the gas flow controller 202 is a valve. The inlet of the process gas flow controller 202 is in fluid communication with the outlet of the manifold 186. The outlet of the process gas flow controller is in fluid communication with the process gas supply conduit 108, which supplies the process gas to the plasma chamber 104. The process gas flow controller 202 controls the flow of the process gas from the outlet of the manifold 186 to the process gas supply conduit 108 and in turn to the plasma chamber 104.

In some embodiments herein, the plasma apparatus 100 may further comprise a computerized control system 208. The computerized control system at least comprises a computer 210. Each of the plurality of gas flow controllers 174, 176, 178, 180, 182, and 184 communicates, by at least one of wired and wireless communication modes, with the computer 210 for receiving control signals from another computer or microcontroller (not shown) that direct the operation of each of the plurality of gas flow controllers at least as to turning off the gas flow from the corresponding one of the plurality of gas storage tanks, turning on the gas flow from the corresponding one of the plurality of gas storage tanks, and setting a flow rate for the gas flow from the corresponding one of the plurality of gas storage tanks.

The process gas flow controller 202 communicates, by at least one of wired and wireless communication modes, with the computer 210 for receiving control signals from the computer that direct the operation of the process gas flow controller 202 at least as to turning off the process gas flow from the manifold 186 to the process gas supply conduit 108 and turning on the process gas flow from the manifold 186 to the process gas supply conduit 108. In some embodiments, the computer 210) may also direct the operation of the process gas flow controller 202 additionally at least as to setting a flow rate for the process gas flow from the manifold 186 to the process gas supply conduit 108 and in turn to the plasma chamber 104.

The power supply 111 for the motor 106 communicates, by at least one of wired and wireless communication modes, with the computer 210 for receiving control signals from the computer 210 that direct the operation of the motor 106 at least as to turning off the rotation of the plasma chamber 104, turning on the rotation of the plasma chamber 104, and setting a speed of rotation of the plasma chamber 104. The electrical power supply 110 communicates, by at least one of wired and wireless communication modes, with the computer 210 for receiving control signals from the computer that direct the operation of the electrical power supply 110 at least as to turning off the electrical power supply 110, turning on the electrical power supply 110, and setting a waveform and parameters of the electrical power supplied to the plasma chamber 104 by the electrical power supply 110 for plasma generation. The power supply 110 may also power the motor 106 or the motor 106 may be powered by a separate power supply, which may also be under the control or direction of the computer 210 as in the illustrated example. In some embodiments herein, various sensors, such as temperature, pressure, and electromagnetic field sensors for example, may also be provided in the vacuum chamber 102 and/or the plasma chamber 104 to provide feedback to the computer 210 in order to enhance control of the plasma treatment processes.

In the operation of the illustrated examples, a batch of particles is placed into the plasma chamber 104. The vacuum chamber 102 is closed/sealed. Most attachments are sealed with copper gaskets, and the frequently opened and closed door 119 is sealed with a VITON™ gasket. A vacuum pump 123 is used to pump the system down to a base pressure. For a base pressure under 1 Torr, a mechanical pump 123 is adequate. For base pressures in the millitorr or lower range, a turbo pump 125 is used after reaching about 0.1 Torr. In the illustrated examples, gas is introduced into the system using the automated control system 208.

In some embodiments, the pressure may be controlled in two ways. First, by controlling the upstream gas delivery-pressure can be directly related to the amount of gas in the vacuum chamber, so increasing or decreasing gas flow can at least in part control pressure in the vacuum chamber 102. Second, by using the downstream vacuum system 122 —after setting specific gas flow, the butterfly throttle valve 143 and/or the gate valve 145 inter alia can be opened and closed to control the chamber pressure. A pressure sensor (or a range of different pressure sensors) is used to measure the chamber pressure to create a feedback loop with the up downstream or downstream control. The computer 210 of the automated control system 208 can be programmed with various valve and pump settings so that the computer 210 can control the vacuum system 122 to obtain specific pressures at specific flow rates in the vacuum chamber 102. The control computer program is flexible and allows very sophisticated processes in a highly reproducible manner. The program is functioning as an interpreter of a recipe written in a process-specific language. The commands of the language define the state of all peripheral hardware, like valves, flow controllers, parameters of electrical supplies, and the time duration between each of the commands getting executed. Examples include alternating deposition of multiple DLC coatings with different mechanical properties over a course of many hours or days.

Figure 6:
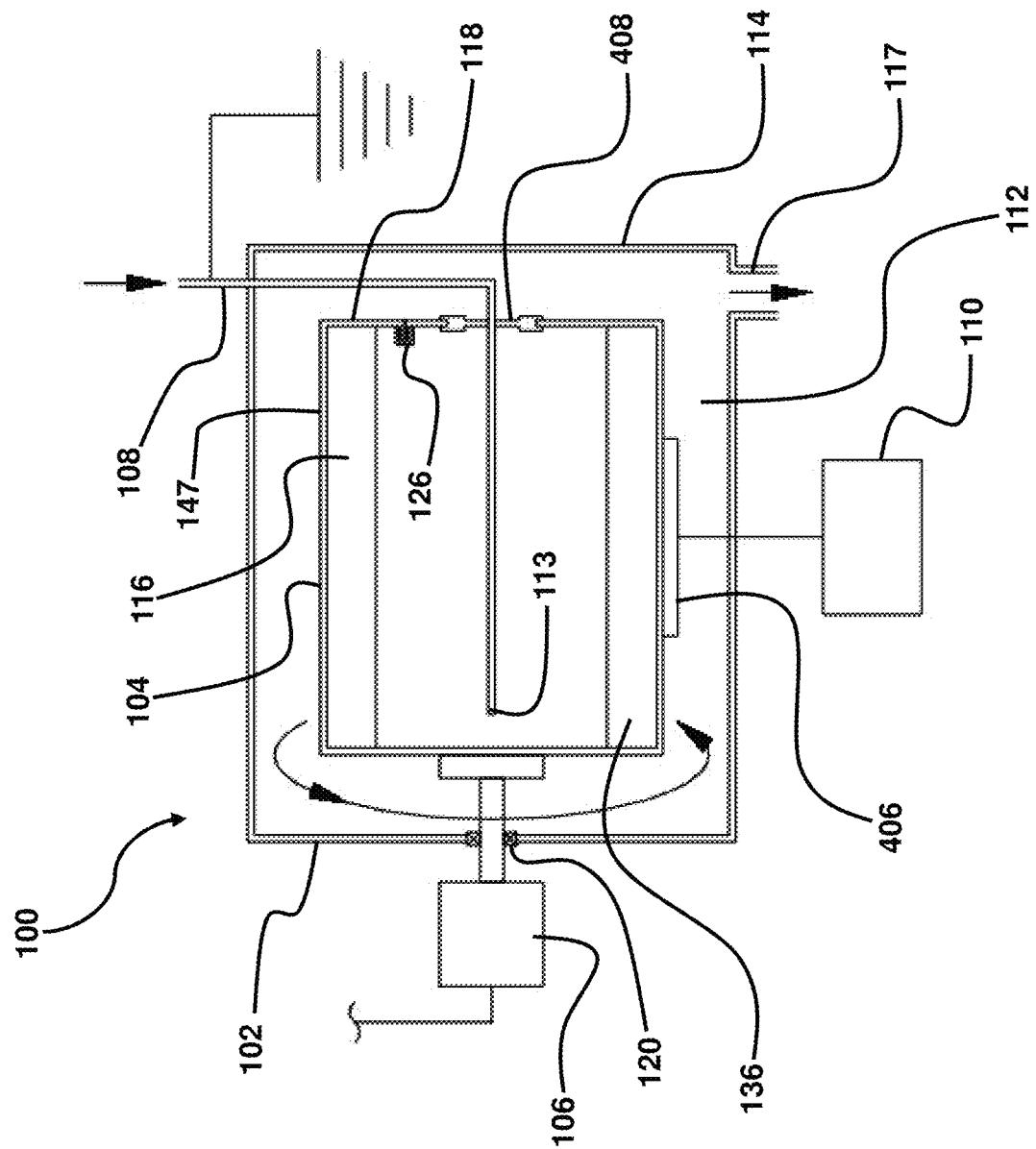
FIG. 6 is a schematic diagram illustrating an embodiment of a plasma apparatus in accordance with some of the embodiments disclosed herein.

In the illustrated example, the cathode is the plasma chamber 104. The power supply 110 may energize or drive the plasma chamber 104 by an AC voltage or current or by a pulsed DC voltage or current. In the illustrated example, the power supply 110 energizes the plasma chamber 104 by a pulsed DC voltage or current. The power supply 110 is electrically connected to the plasma chamber 104 by a sliding contact 406 such as, for example, a brush. In the example of FIG. 6, the gas supply conduit 108 is grounded. The example of FIG. 6 employs the Hollow Cathode Effect, which is further discussed below, and the plasma chamber 104 acts as the hollow cathode. The plasma chamber 104 may also be provided with an electrically insulating sealing member 408 at its inlet. The sealing member 408 seals the gap between the gas supply conduit 108 and the inlet opening in the plasma chamber 104 for the gas supply conduit 108 to keep the particles being coated in the plasma chamber 104 and prevent those particles from escaping into the vacuum chamber 102 and/or the vacuum chamber outlet 117. The sealing member 408 also electrically insulates the gas supply conduit 108 from the plasma chamber 104. The sealing member 408 may be provided to rotate with the plasma chamber 104, or the sealing member 408 may remain stationary while the plasma chamber 104 rotates relative to the sealing member 408. The plasma chamber 104 may be provided with a vent 126 as previously discussed.

In the illustrated example, the vent 126 is a small tube that projects a short distance into the plasma chamber 104 that allows fluid communication between the interior of the plasma chamber 104 and the interior of the vacuum chamber 102 to allow the vacuum system 122 to generate low pressures in both the plasma chamber 104 and the vacuum chamber 102. The open end of the small vent tube that is inside the plasma chamber is covered by a cap. The cap surrounds the portion of the vent tube inside the plasma chamber 104 and while being spaced apart from the vent tube. The cap is vented to the interior of the plasma chamber near the base of the vent tube to create a tortuous pathway for gas from the interior of the plasma chamber, between the cap and the vent tube, through the vent tube, and to the exterior of the plasma chamber in order to retain the particles in the plasma chamber 104 while permitting fluid communication between the interior of the plasma chamber 104 and the interior of the vacuum chamber 102 for the purpose of generating the required low pressures in both the plasma chamber 104 and the vacuum chamber 102. The space between the vent tube and the associated cap may optionally be filled with a filter, mesh, or other gas permeable material.

As an alternative, a simple vent hole may be provided in the one end portion of the plasma chamber that is plugged with a gas permeable material. Such a vent hole plugged with a gas permeable material may also be provided in the sealing member 408. As yet another alternative, at least some portion of the sealing member 408 may be made of a gas permeable material.

Figure 14:
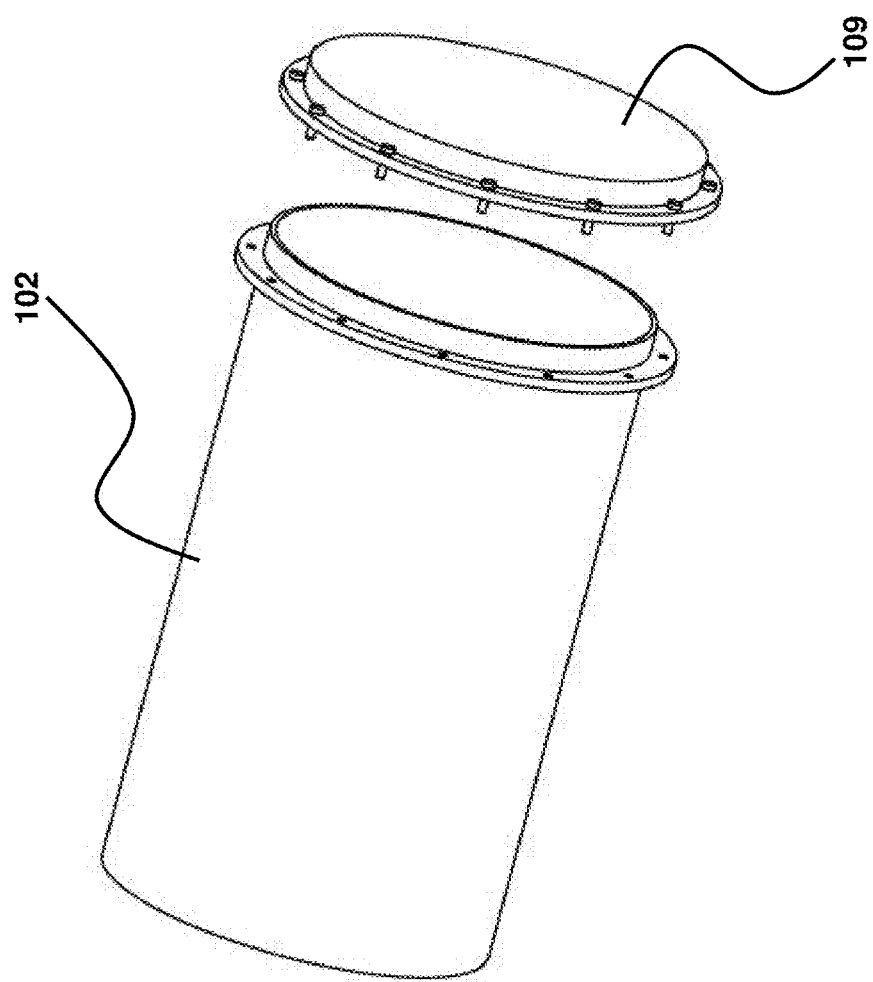
FIG. 14 is a simplified diagrammatic depiction of the vacuum chamber showing the vacuum chamber door in accordance with some of the embodiments disclosed herein.
Figure 15:
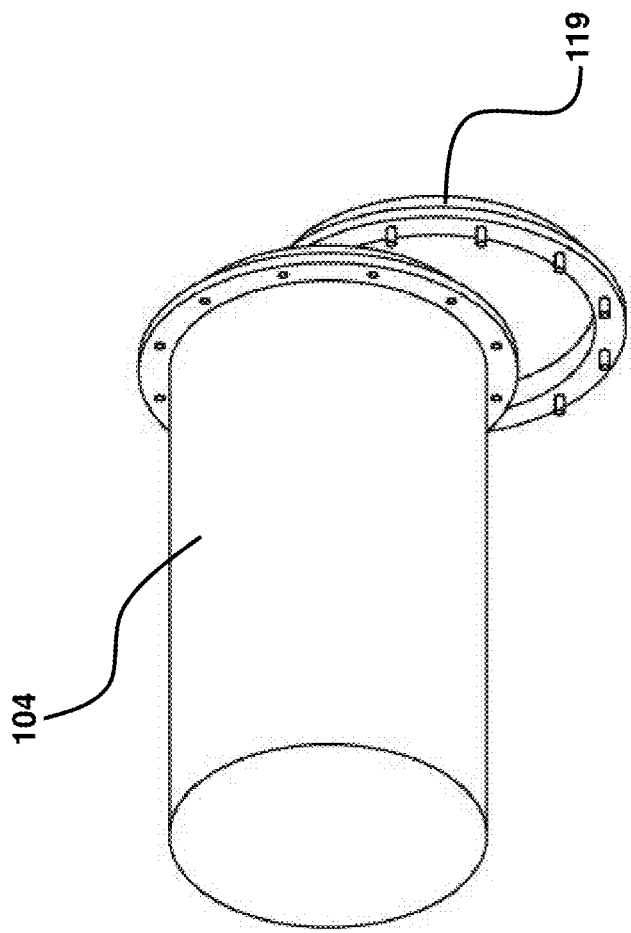
FIG. 15 is a simplified diagrammatic depiction of the plasma chamber showing the plasma chamber door in accordance with some of the embodiments disclosed herein.

In some embodiments herein the vacuum chamber 102 may be cylindrical. Both the vacuum chamber 102 and the plasma chamber 104 are provided with lids or doors for charging of the plasma chamber with particles in the case of the plasma chamber and for access to the plasma chamber in the case of the vacuum chamber. The doors or lids are not shown in most of the drawings in the interest of clarity. However, examples of doors or lids 109 and 119 for the vacuum chamber 102 and the plasma chamber 104, respectively, are shown in FIGS. 14-15 for illustrative purposes. In these examples, the vacuum chamber 102 and the plasma chamber 104 and their respective lids or doors are flanged and secured by screws. Sealing gaskets (not shown) may be provided between each of the vacuum chamber 102 and the plasma chamber 104 and their respective doors or lids.

Figure 12:
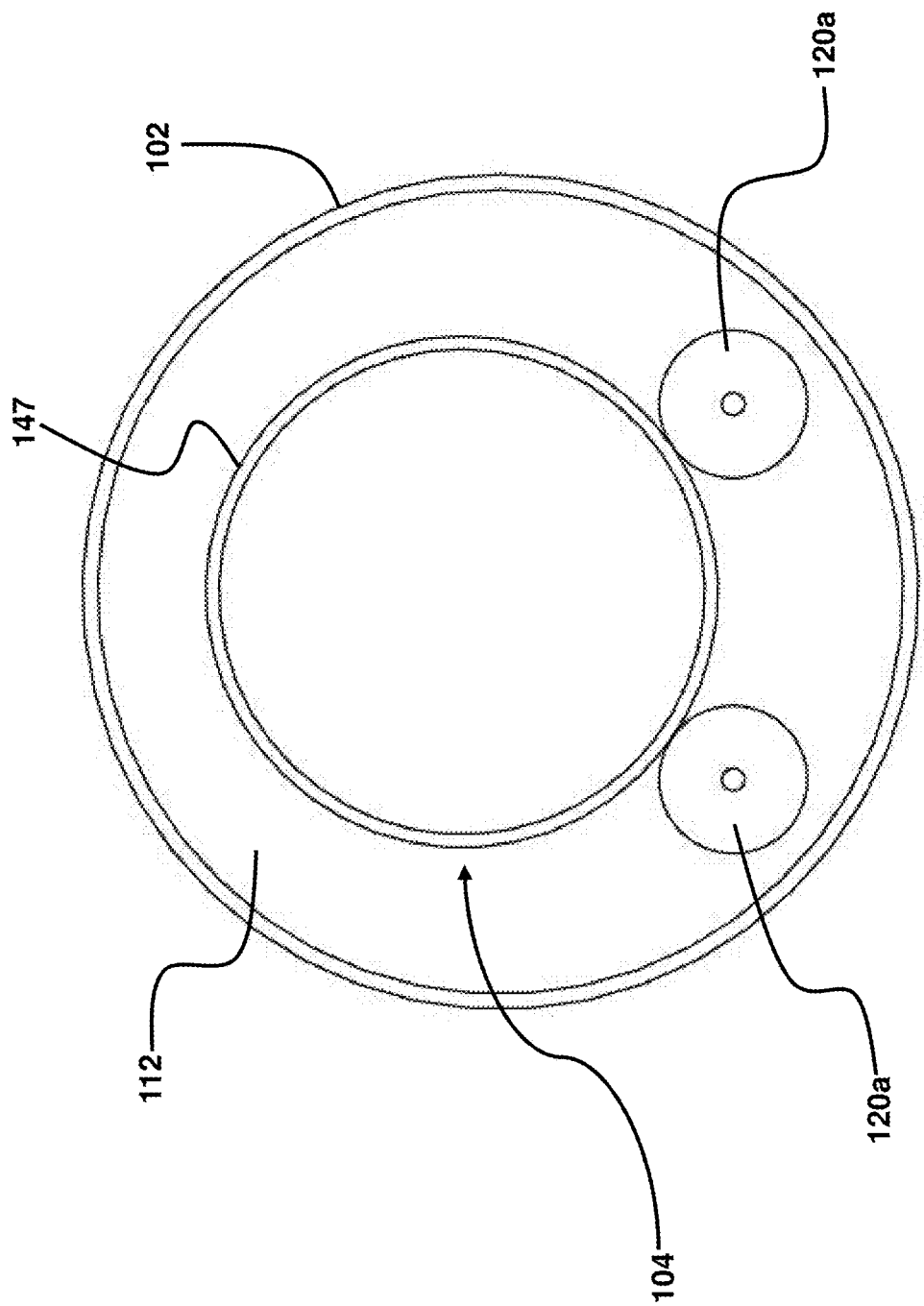

The comminuted material includes particles as previously stated, and the rotation of the plasma chamber 104 causes the agitation of the comminuted material to enhance the exposure of the surfaces of the comminuted material to the plasma treatment. In some embodiments, the comminuted material treated by the apparatus 100 may be a comminuted solid fuel. The types of plasma treatments that can be carried out using the apparatuses in accordance with the embodiments herein include, but are not limited to, plasma cleaning, plasma coating, plasma deposition, and surface functionalization In some embodiments such as that illustrated in FIGS. 11-12, the electrically insulating supports include at least one pair of cylindrical electrically insulating supports 120a located inside the vacuum chamber 102. In the illustrated example of FIGS. 11-12, two pairs of cylindrical electrically insulating supports 120a are used with one pair being in tandem with the second pair in the direction of the axis of rotation of the plasma chamber 104. In some embodiments herein, these two pairs of cylindrical electrically insulating supports 120a may be replaced by a single pair of longer cylindrical electrically insulating supports that extend at least along a majority of the length of the plasma chamber 104. The axes of rotation of the cylindrical electrically insulating supports 120a are parallel to the axis of rotation of the plasma chamber 104 in the illustrated example. In some embodiments, the exterior of the plasma chamber 104 includes a cylindrical exterior surface 147, and the cylindrical electrically insulating supports 120a are in contact with the cylindrical exterior surface 147 of the plasma chamber 104. In the illustrated example, the plasma chamber 104 is located on the cylindrical electrically insulating supports 120a. In the illustrated example, the cylindrical electrically insulating supports 120a are elongated and have longitudinal axes that are parallel to one another and parallel to the axis of rotation of the plasma chamber 104. When viewed with the axis of rotation of the plasma chamber 104 pointing toward the viewer as shown in FIG. 12, one or more first cylindrical electrically insulating supports 120a are positioned to one side of the axis of rotation of the plasma chamber 104, and one or more second cylindrical electrically insulating supports 120a are positioned to the other side of the axis of rotation of the plasma chamber 104. The longitudinal axes of the first and second cylindrical electrically insulating supports 120a are spaced some distance apart from one another, and the distance between the first and second cylindrical electrically insulating supports 120a is less than the diameter of the plasma chamber 104.

In some embodiments, the motor 106 may be arranged to impart rotation to one or more of the cylindrical electrically insulating supports 120a in order to impart rotation to the plasma chamber 104.

Figure 13:
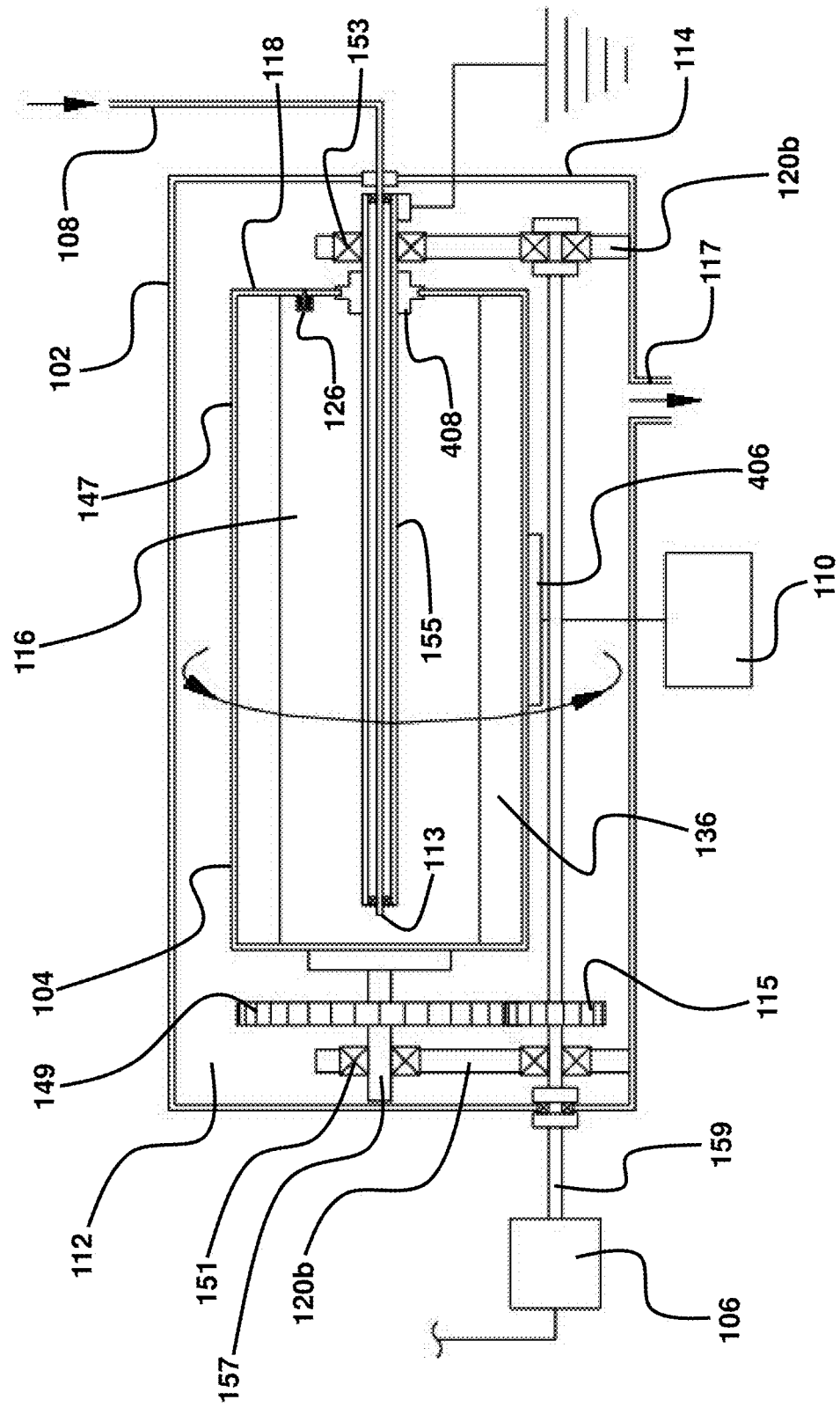
FIG. 13 is a schematic diagram illustrating a third example of a plasma apparatus in accordance with some of the embodiments disclosed herein.

In some embodiments such as that illustrated in FIG. 13, the motor may be arranged to impart rotation to the plasma chamber 104 through a set of gears 115 and 149 that are made of an electrically insulating material. In the illustrated example, the motor 106 imparts rotation to the gear 115 by rotating the countershaft 159. The gear 115 is in mesh with the gear 149 such that rotation of the gear 115 imparts rotational motion to the gear 149, which in turn causes the rotation of the plasma chamber 104. In some embodiments, one or more of the process gas supply conduit 108 and a bar 155 extending into the plasma chamber 104 is used as a ground electrode. The bar 155, which is used as the ground electrode, extends into the plasma chamber 104, and is located at least near the center axis of the plasma chamber 104. In the example of FIG. 13, the bar 155 is hollow and coaxial with the gas supply conduit 108. Gaps between the stationary bar 155 and the gas supply conduit 108 are sealed. Alternatively, the bar 155 and the gas supply conduit 108 may extend side by side into the plasma chamber 104 such that the two are in parallel and their longitudinal axes are spaced apart. In such a case, the sealing member 408 would remain stationary while the plasma chamber 104 would rotate relative to the sealing member 408.

The example of FIG. 13 also illustrates alternative electrically insulating supports 120b that are in the form of insulating plates 120b that support bearings 151 and 153 that support the plasma chamber 104. The bearing 151 supports the shaft 157, which projects from one end of the plasma chamber 104, in such a way as to permit rotation of the shaft 157 with the plasma chamber 104. The bearing 153 may support the bar 155 for rotational motion such that the bar 155 rotates with the plasma chamber 104. Alternatively, the bearing 153 may support the bar 155 such that the bar 155 remains stationary with respect to the plasma chamber 104, in which case the sealing member 408 must be configured to permit relative rotation between the bar 155 and the plasma chamber 104.

When the support members 120b are electrically insulating, the support bearings 151 and 153 need not be electrically insulating. If the support bearings 151 and 153 are electrically insulating, then the support bearings 151 and 153 can be thought of as electrically insulating supports and the support members 120b need not be electrically insulating.

In some embodiments, the motor 106 may be located inside the vacuum chamber 102, with proper shielding if necessary. This arrangement may reduce the number of openings in the wall of the vacuum chamber and thus reduce the chance leakage that can impede the vacuum system 122. In some embodiments herein, the supporting plates 120b may support shafts that support the electrically insulating cylindrical supports 120a. The supporting plates 120b may support shafts that support the electrically insulating cylindrical supports 120a in addition to supporting the plasma chamber 104. The shafts supporting the electrically insulating cylindrical supports 120a may rotate with the electrically insulating cylindrical supports 120a or the electrically insulating cylindrical supports 120a may rotate relative to the shafts supporting them.

Examples of other plasma treatment apparatuses for plasma treatment of comminuted material are disclosed in U.S. patent application Ser. No. 17/665,795, filed on Feb. 7, 2022, by the inventors herein, which is incorporated by reference herein in its entirety.

Macro, Micro, and Nano Scales Defined

Macro scale refers to objects having dimensions that are greater than 100 micrometers. Micro scale refers to objects having dimensions that are from about 100 nanometers to about 100 micrometers. Nano scale refers to objects having dimensions that are from about 1 nanometer to about 100 nanometers.

Particle Size Range for which the Process can be Used

The embodiments herein have been used to coat powders as small as 3 nm. In one exemplary embodiment, a part that was 50 inches long by 10 inches wide was coated. Accordingly, it may be said that the embodiments herein have to date been successfully employed to coat powder particles, pellets, or comminuted material having dimensions of any size greater than about 3 nm.

Hollow Cathode Effect

This is a plasma physics phenomenon, which happens because electrons seem to preferentially want to be contained in hollow cylindrical spaces. Basically electrons get trapped inside of the tube. When they are flying around they will be emitted from one surface and fly towards the other wall, the opposite side (or opposing emitter) slows the electron down and "shoots" it back to the other side. This continually happens, making a very high density electric field, which creates a high density plasma.

One of the main advantages of hollow cathodes is that electrons being emitted from the emitter surface may actually accelerate to the opposing emitter surface, being that the cathode shape is a hollow cylinder, and thus ionize gas which is "in the way" (to put it in simple words). When an energetic electron reaches the opposing surface the electric field slows it down and "shoots" it back up. In this way, an electron may bounce back and forth between the sides of the emitter's inner surface, a phenomenon that is also referred to as the "pendulum effect."

An Example of Operation of the Vacuum System

The vacuum system 122 may comprise a sealed stainless steel deposition system, vacuum pumps, pressure controller, downstream pressure control, a gas delivery system, and an automated control system.

i) Samples are placed into the deposition system.

ii) The deposition system is closed/sealed. Most attachments are sealed with copper gaskets, the frequently opened and closed door is sealed with a Viton™ gasket.

iii) A vacuum pump is used to pump the system down to a base pressure. For a base pressure under 1 Torr, a mechanical pump is adequate. For base pressure in the millitorr range or lower, a turbo pump is used after reaching about 3.5 mTorr.

iv) Gas is introduced into the system using an automated control system.

v) The pressure can be controlled by either of the following:

(1) Upstream gas delivery—pressure can be directly related to pressure, so increasing or decreasing gas flow can control pressure; and (2) Downstream—after setting a specific gas flow, a butterfly throttle valve can be opened and closed to control the chamber pressure.

vi) A pressure control gauge (or a range of different gauges) is used to measure the chamber pressure to create a feedback loop with one or both of the upstream and downstream controls. In some embodiments of the apparatus, an automation system has been set up to use control schemes or "recipes" where the computer controls the vacuum system to obtain specific pressures at specific flow rates.

Nature and Purpose of Surface Functionalization

Surface functionalization is a technique to alter the surface properties of material or a device to achieve specific goals such as inducing or inhibiting a response. The adhesion of the DLC coatings will depend upon the substrate surface. Surface functionalization can be used as a technique to improve adhesion of the DLC coatings to the substrate materials. In other cases, adhesion may be improved by removing oxide layers through a plasma cleaning process using a reducing gas, such as hydrogen gas. The DLC coatings in accordance with the embodiments herein have also been used to further add specific functionalization for purposes such as hydrophobicity or hydrophilicity, chemical resistance, corrosion resistance, biocompatibility, toxicity masking, sensing substrates used in sensors, etc. Silanes represent one category of chemicals that can be used to functionalize the surface and can be applied and introduced into the plasma chamber in a vapor or gas phase, or may be applied externally.

Gas Flow Rates

The flow rate refers to the flow rate of a specific gas, not the total gas mixture. Flow rates are a function of the deposition system chamber size, part (i.e. the object or objects to be coated) surface area, and pump size. As the batch size is increased, the surface area of the particles will significantly increase requiring either more gas (more C) or longer deposition times. After any applicable surface cleaning and treatment, $C_2H_2$ gas is introduced at a flow rate of 50 sccm, causing an increase in pressure to 127.3 mTorr. During gas introduction to the chamber, the plasma source was energized and a plasma formed. The pressure slowly dropped to 83 mTorr after 300 minutes, followed by an increase in pressure to 116 mTorr at 719 minutes. Power to the plasma source was disconnected at 720 minutes, this was followed by an increase of pressure to 131 mTorr.

Further Example Embodiments

Some embodiments herein provide processes that can be applied to coat and encapsulate RP, a solid fuel, having dimensions from the nano to macro size scales. The processes for forming DLC coatings in accordance with the embodiments herein have been shown to produce protective coatings having a tunable thickness from 2 nm to 8 nm with varying deposition times from 1 to 30 min/g, respectively. This is just an example provided for illustrative purposes; however, much thicker coatings may be applied by increasing the time per gram of the deposition process. The embodiments herein also provide for functionalizing the coatings with Hydrogen, Oxygen and/or Fluorine, Boron, Silicon, Nitrogen, etc. Coating thickness is predominately limited only by the time available for deposition.

The embodiments herein include the use of a vacuum chamber 102 with a pulsed Direct Current (DC) source to generate a plasma in a low-pressure (Torr or mTorr) atmosphere of the process gas. Located inside the vacuum chamber 102 is the plasma tank or chamber 104 to hold the specimen being coated, reactive and inert gases, generated plasma, gas inlets and outlets, and control sensors. DLC coatings are typically formed in the 80-150 mTorr gas pressure range. An in-situ plasma has been found to improve the coating during deposition, this has been demonstrated by using a DC-pulse power source operating in a voltage range of 1-5 kV per pulse, with a frequency range of 500 Hz to 3 kHz. and pulse width of 1-25 microseconds to generate a plasma. The plasma tank 104 incorporates design features to improve the uniformity and low defect concentration in DLC coatings. Features may exist within the plasma tank to improve distribution of the specimen in the plasma for even coating, such features may include ribs that extend along the longitudinal, radial, or helical axes. Designs may incorporate impellers or other methods to agitate the material being coated to ensure an even distribution. Additional media, such as balls (e.g. stainless steel, alumina, etc.) for milling may be added to the plasma tank 104. Fins 136 have been added inside the walls of the rotating tank 104 for mixing and more uniform coating.

Some illustrative embodiments herein use the following conditions:

Plasma chamber rotational speeds: 0.02 rev/sec (plasma cleaning); 0.5 rev/sec (DLC and graphitic film deposition). The plasma chamber rotational speeds have been significantly varied from 0.01-1.0 rev/sec. The plasma chamber rotational speeds may be decreased as the tank diameter is increased.

Example flow rates:

Plasma Cleaning: 5-50 sccm Ar+15-75 sccm $O_2$ 1-30 min/g; 5-30 sccm Ar+15-75 sccm $H_2$.

DLC coatings deposition: 25-100 sccm methane; deposition time approx. 220 min.; 25-100 sccm acetylene; deposition time approx. 220 min.

Deposition time and time per gram depend on the desired coating thickness and the batch size.

Post coating surface functionalization: $O_2$ 15-75 sccm for 30 min; Fluorine source (such as a fluorinated hydrocarbon; 1,1,1,2-Tetrafluoroethane) 25-75 sccm for 80 minutes; Silicon source such as Hexamethyldisiloxane (HMDSO) with a vapor flow controller 25-75 sccm for 80 minutes.

This is dependent on a variety of variables. Maybe between 50 nm-250 nm/hour.

A pulsed DC power supply was used with a range of voltage of 1-5 kV pulses, with a frequency range of 500 Hz to 3 kHz, and pulse width of 1-25 micro seconds.

The rotation of the tank may be varied. This is generally proportional to the diameter of the tanks that are used. The ratio of the length vs diameter of the tank may vary as it is optimized for various applications, and a range of such ratios may be practicable for each application. The rotational speed of the tank may be decreased with increases in diameter.

The apparatus to form DLC coatings on solid fuels allows the gas flow rate as well as the base pressure to be varied independently. General cleaning of the powder to be coated is carried out at pressures in the range of 1-100 mTorr. The coating deposition may be carried out at pressures on the order of hundreds of milli-torrs and sometimes lower (e.g. 50-500 mTorr). The gas flow rates may vary from about 5 sccm to about 150 sccm.

Different hydrocarbons (e.g. acetylene or methane) may be used in the deposition gas, and carrier gasses such as nitrogen, argon, and Oxygen may also be added to adjust the deposition rate to the desired level.

The rotating tank uses the Hallow Cathode Effect to intensify the plasma. The tank diameter and the fill percentage for each material also can affect plasma density, which also affects the deposition rate.

Coatings may be applied in a single operation, concurrent operations with multiple simultaneous gas and/or vapor sources, or in sequential operations with multiple gas and/or vapor sources. Treatment with oxidizing or reducing environments may occur between operations.

Experimental Procedure and Results

DLC coatings are comprised of rigid amorphous or crystalline networks consisting of $sp^3$ and $sp^2$ hybridized carbon atoms and exist in a thermodynamically metastable phase, with $sp^3$ hybridized carbon being the dominant form of carbon present in DLC networks, while $sp^2$ hybridized carbon is the dominant form in graphitic film networks. These coatings are referred to as diamond-like because they share the same properties that are advantageous for crystalline diamonds. e.g. they are hard, chemically inert, and transparent in the infrared. Some DLC coatings in accordance with the embodiments herein may contain hydrogen atoms while others may not; this is merely an artifact of the processing conditions. Some DLC coatings in accordance with the embodiments herein may contain both graphitic and diamond-like phases. DLC coatings can be doped with other elements, such as Titanium, Boron, etc. These dopants can act to modify the electronic and conductivity properties of the coating while maintaining the other salient characteristics of the coating.

DLC coatings are typically confirmed by using Raman spectroscopy. DLC will exhibit a sharp Raman band near 1560 $cm^{-1}$, associated with the G band, and a broad shoulder band out to 1350 $cm^{-1}$, associated with the D band. This is illustrated in FIG. 1 below, each feature is clearly visible. Dopants may shift or alter the appearance of the RAMAN spectrum and intensities; however, this shift or altered appearance does not necessarily rule out the presence of DLC.

It is difficult to do many of the common DLC analysis techniques on powders and small particles.

Hardness is difficult to determine and precisely specify for powders or small particles; however, DLC hardness is typically observed in the range of 10-100 GPa and have a Young's modulus in the range of 100-500 GPa. Experiments with the embodiments herein have demonstrated how the chemical inertness property of the DLC coatings in accordance with the embodiments herein protect coated RP from chemical degradation processes. Experiments with the embodiments herein have further demonstrated excellent hydrophobicity imparted by the DLC coatings in accordance with the embodiments herein on RP by immersion in water; uncoated RP disperses in water while treated RP clumps and floats on the surface.

The other tests can show a change in surface functionalization.

Figure 16:
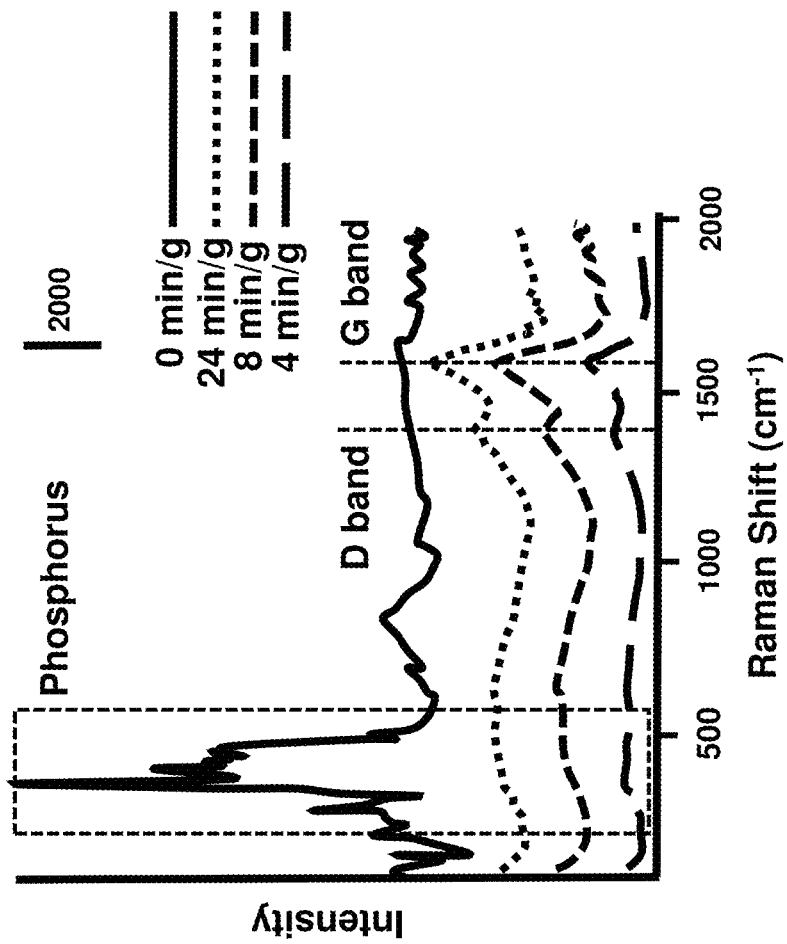
FIG. 16 is a graph showing a comparison of the Raman spectra at 532 nm of coated RP flakes and uncoated RP Flakes with corresponding deposition times in accordance with some of the embodiments herein.

FIG. 16 shows examples of some RAMAN spectra for DLC coated and uncoated RP. These curves are drawn with different corresponding line types for the different samples. The solid line curve for the uncoated particles shows bands for RP appearing at Raman shift wavelengths below 500 $cm^{-1}$. The short-dashed, dashed, and long-dashed curves are for RP coated at 24 min/g, 8 min/g, and 4 min/g, respectively. In these three curves, the phosphorus signal from the RP surface can be seen to disappear, and new bands at near 1586 $cm^{-1}$ and 1350 $cm^{-1}$ appear. The new bands near 1586 $cm^{-1}$ and 1350 $cm^{-1}$ correspond to the "G" and "D" bands, respectively. The positions of the "G" and "D" bands, their half wavelength width, and the relative ratios of "D" band to "G" band intensity are used to analyze the carbon materials structure. The broad bands of D" and "G" in FIG. 16 indicate the high disorder of the carbon structure (amorphous structure) in the material, a typical material structure of DLC. Therefore, the solid fuel particles can be conformally coated. As can be seen in FIG. 16, the "G" and "D" band intensities increase with longer deposition times. Regardless of the deposition time, the G band remains between 1585 $cm^{-1}$ and 1590 $cm^{-1}$ and the I(D)/I(G) remains approximately 0.45. These facts show the coating's formation can be well repeated with the same material structure with this plasma process system.

Multiple experiments have been performed to demonstrate protection against degradation of coated vs. uncoated RP (a solid fuel).

The protection provided by the coatings in accordance with the embodiments herein has been quantified as a function of coating thickness.

The level of protection against degradation provided by applying an additional plasma cleaning step prior to coating in accordance with the embodiments has also been quantified.

Figure 17:
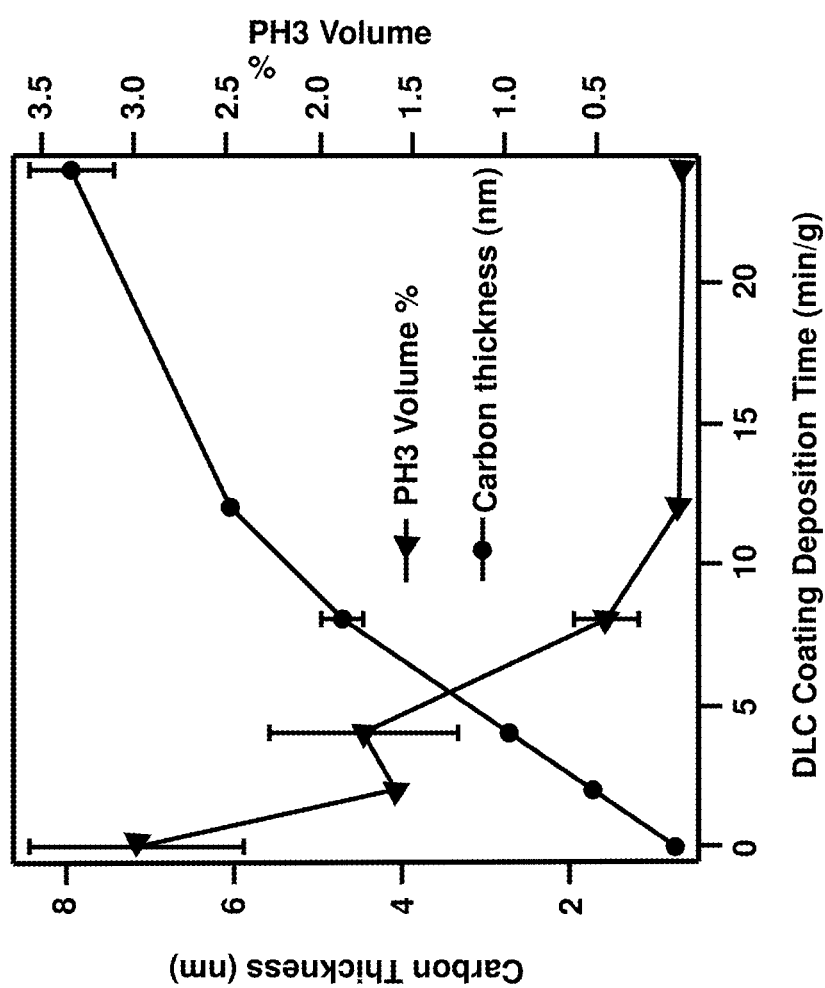
FIG. 17 is a graph showing the effect of coating deposition time on coating thickness and on phosphine (PH3) evolution.
Figure 18:
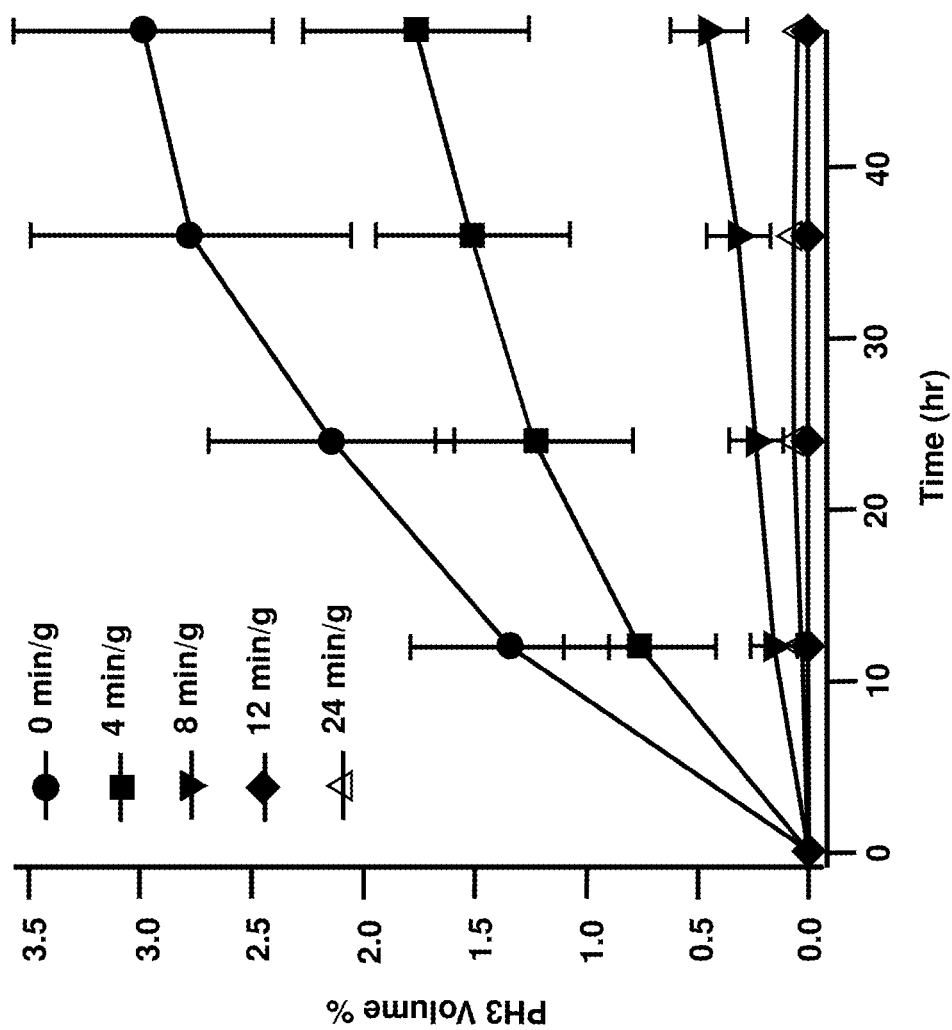
FIG. 18 is a graph showing the effect of coating deposition time on PH3 gas evolution.

Coating thickness and phosphine (PH3) evolution as functions of coating deposition time are shown in FIG. 17. The effect of coating deposition time on PH3 gas evolution over time is shown in FIG. 18.

Figure 19:
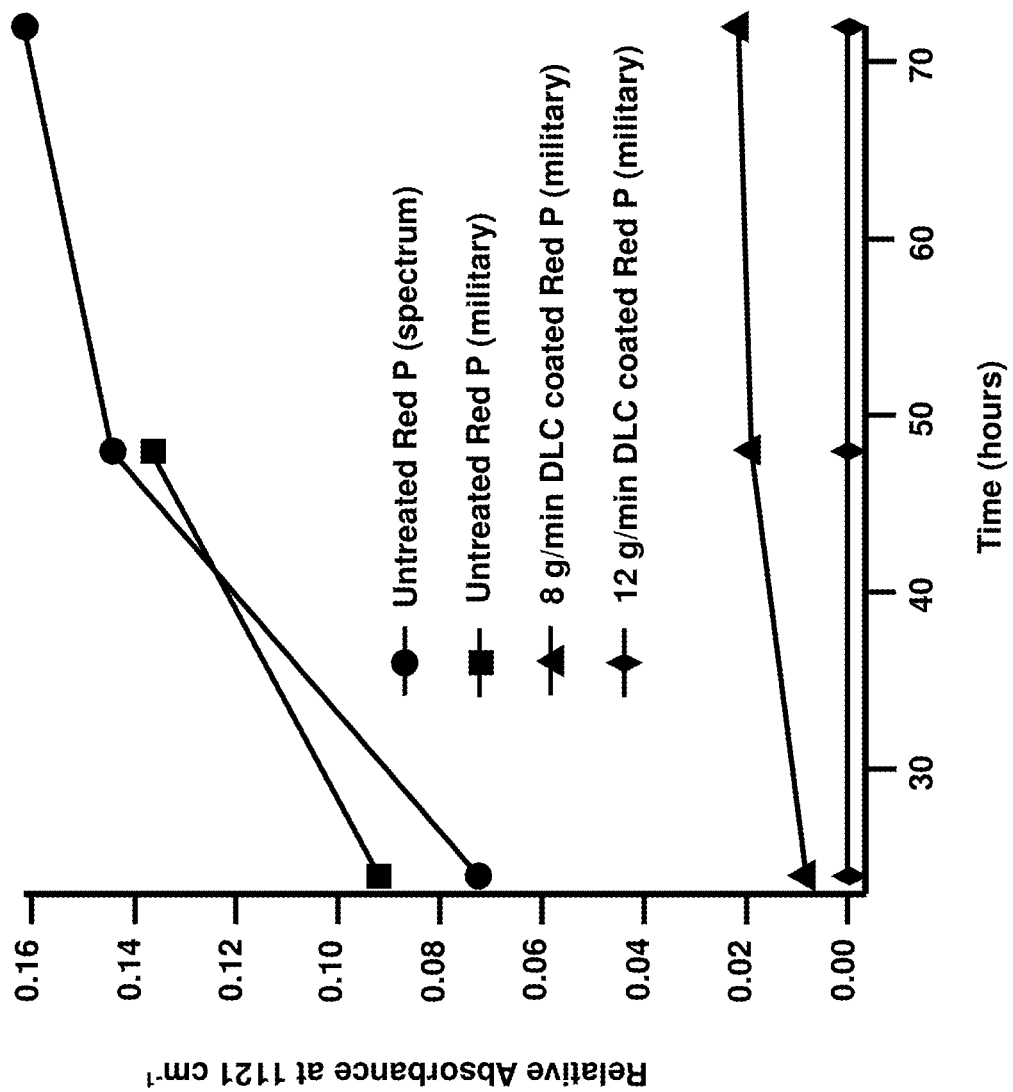
FIG. 19 illustrates the results from a phosphine evolution study for coated and uncoated solid fuel RP where the phosphine gas phase concentration was monitored by infrared (IR) light absorbance at 1121 cm$^{-1}$.
Figure 20:
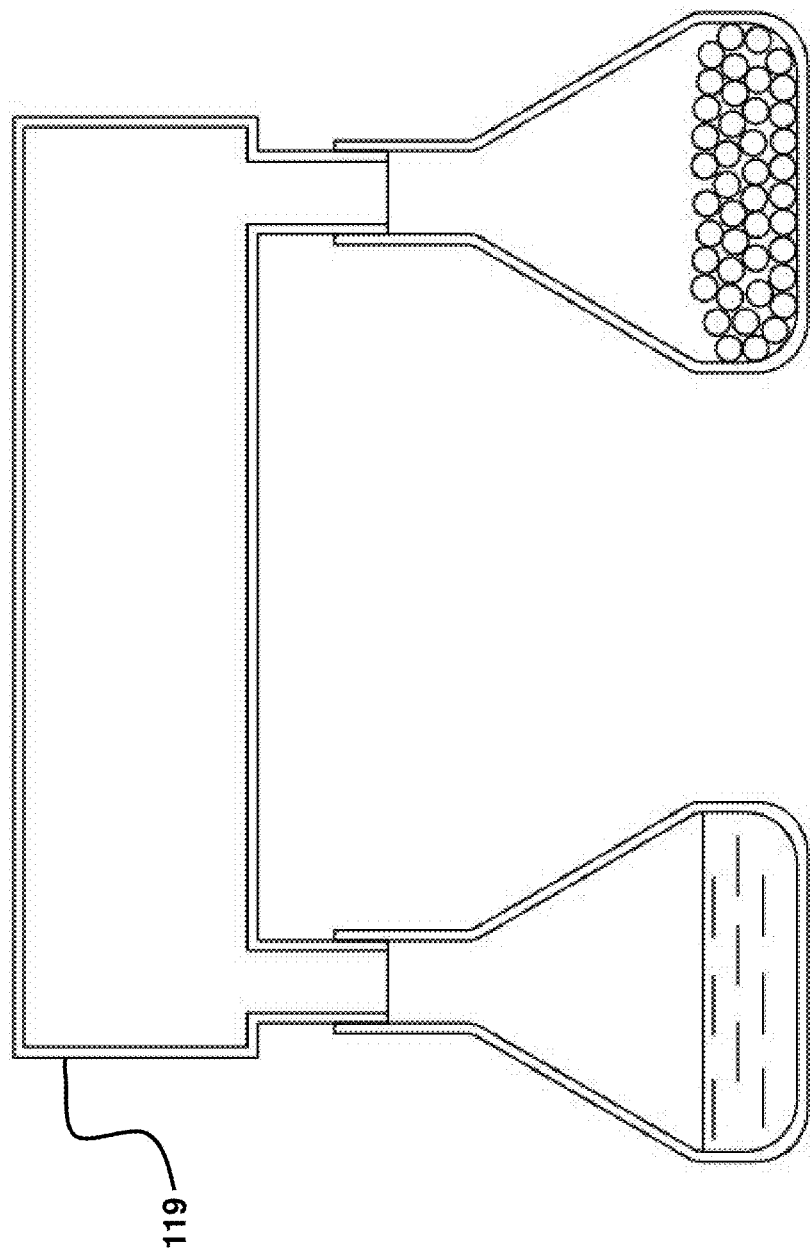
FIG. 20 shows a schematic diagram of the sample incubation chamber used for temperature and humidity testing of coated solid fuel particles in accordance with some of the embodiments herein.

The coating efficacy of the embodiments herein has been further confirmed by evaluating the relative performance of coated vs uncoated RP for a longer exposure time, through 70 hours, as shown in FIG. 19. For this evaluation, the samples were heated at 50° C. for up to 6 days in the incubation chamber 161, a diagram is presented in FIG. 20. The incubation temperature created a 100% Reducing Hydrogen (RH) environment.

Figure 21:
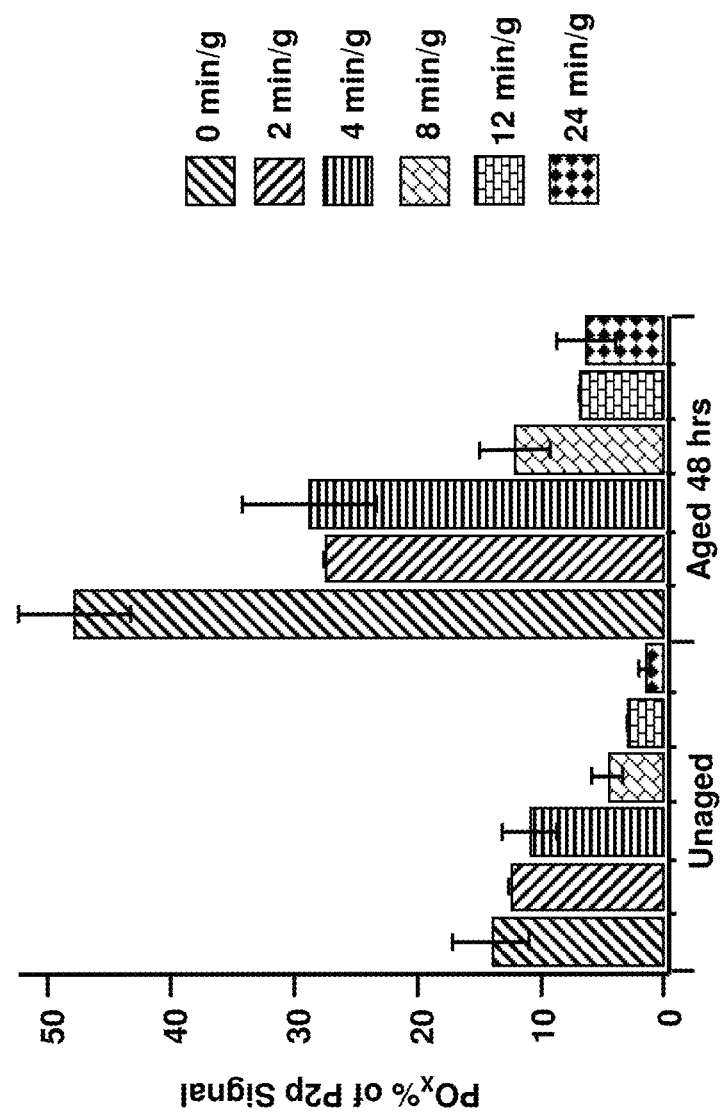
FIG. 21 is graph showing the x-ray photoelectron spectroscopy (XPS) P2p signal for surface phosphorus oxides formation for specific deposition times of aged and unaged samples of uncoated RP and RP coated in accordance with the embodiments herein.

Further evaluation of the solid fuel surface for uncoated RP samples and coated was carried out to determine how the surface treatment affects formation of phosphorus oxide degradation byproducts on the surface. This was achieved by using x ray photoelectron spectroscopy (XPS) to measure the relative intensities of the P2p XPS signal for aged and unaged, coated and uncoated samples. A clear correlation exists between coating time and reduction in surface phosphorus oxide formation, these results are shown in FIG. 21.

Effect of surface treatment on DLC coatings formation and thickness:

Surface treatment was investigated to determine any correlation between pre-processing parameters and the formation of DLC coatings. To evaluate the benefit of reducing the solid fuel surface prior to coating, a sample was prepared using an argon and hydrogen plasma treatment at 2 min/g, followed by an argon plasma treatment at 2 min/g; the results relating to this sample are presented as sample 3 in Table 1. The effect of the hydrogen reduction was then evaluated by testing for comparison samples formed with an argon-only plasma treatment for 2 min/g and 4 min/g; these were sample 6 and sample 7, respectively, shown in Table 1.

A clear correlation between pre-processing with hydrogen to reduce the solid-fuel surface and the thickness of the subsequently formed coating can be observed, when compared to only argon plasma pre-treatment.

TABLE 1

Effect of plasma pre-deposition cleaning processes on coating thickness for a given deposition time (i.e. DLC coating time).

| Sample | DLC Coating (min/g) | Ar + $H_2$ Plasma (min/g) | Ar Plasma (min/g) | Aging (hr) | Carbon Thickness (nm) |
|---|---|---|---|---|---|
| 3 | 8 | 2 | 2 | 0 | 4.71 ± 0.24 |
| 6 | 8 | 0 | 2 | 0 | 3.68 |
| 7 | 8 | 0 | 4 | 0 | 3.48 |

The ability of the applied films to protect against solid fuel degradation was then evaluated. For this evaluation, the presence of phosphorus oxides formed on the solid fuel surface was determined by measuring the signal for the phosphorus oxides as a percentage of the signal for P2p, both without aging and after aging for 40 hours. These results are presented in Table 2. A clear reduction in degradation for the sample prepared with both the hydrogen reduction plasma treatment and argon plasma treatment can be seen, when compared to samples only having an argon plasma treatment.

TABLE 2

Effect of plasma pre-deposition cleaning processes on formation of surface phosphorus oxides for a given deposition time for aged and unaged samples.

| Sample | DLC Coating (min/g) | Ar + H2 Plasma (min/g) | Ar Plasma (min/g) | Aging (hr) | C/P ratio | $PO_4$ percent of P2p signal | $PO_4$ Thickness (nm) |
|---|---|---|---|---|---|---|---|
| 3 | 8 | 2 | 2 | 0 | 30.79 ± 4.07 | 4.58 ± 1.36 | 0.32 ± 0.05 |
| 3 | 8 | 2 | 2 | 48 | 16.00 ± 2.17 | 12.21 ± 2.73 | 1.00 ± 0.17 |
| 6 | 8 | 0 | 2 | 0 | 17.18 | 4.89 | 0.46 |
| 6 | 8 | 0 | 2 | 48 | 11.90 | 14.00 | 1.21 |
| 7 | 8 | 0 | 4 | 0 | 15.21 | 6.84 | 0.58 |
| 7 | 8 | 0 | 4 | 48 | 9.24 | 18.69 | 1.59 |

Figure 22:
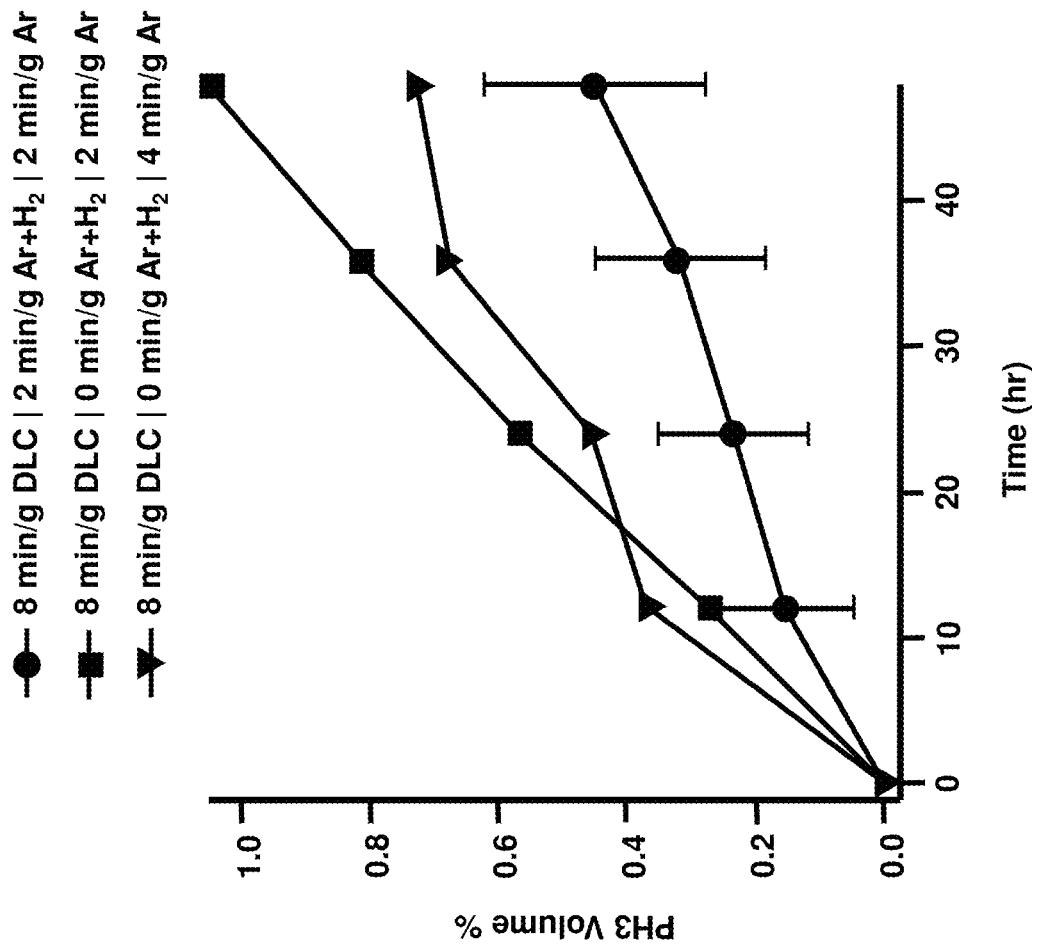
FIG. 22 is a graph showing the effect of plasma cleaning processes on PH3 evolution for a given deposition time.

Phosphine evolution for these three samples was studied during the aging process and the results are presented in FIG. 22. A reduction in phosphine evolution is noticeable for the sample pre-processed using the hydrogen-argon plasma followed by argon plasma treatment prior to film coating when compared to the samples only having an argon plasma treatment.

Examples of uses for coated RP or other solid fuels include use in pyrotechnic compositions, use in thermite and thermate compositions, use in aerosol forming compositions. Use in gas forming compositions, e.g. for air bag inflators. Use in primer compositions for ammunition. Use in cartridge-actuated devices, e.g. squib.

Preparation of Experimental Samples

RP samples were coated under different conditions to study a) the effect of deposition time, b) the effect of plasma cleaning, and c) the effect of increasing the mass of RP in a batch for process optimization.

a) The samples for the study of the effect of DLC coating deposition time each included 30 g RP treated by plasma cleaning with $H_2$ plasma for 2.0 min/g and plasma treatment with Ar plasma for 2.0 min/g. The samples were prepared with DLC coating deposition times of 2 min/g, 4 min/g, 8 min/g, 12 min/g, and 24 min/g.

b) The samples for the study of the effect of the plasma cleaning process each included 30 g RP with a DLC coating deposition time of 8.0 min/g. Each sample was treated with a corresponding one of the following cleaning processes:
1) 2 min/g $H_2$ reduction of native oxides, and then 2 min/g Ar sputtering off PH3; and
2) Only 2 min/g Ar sputtering; and
3) Only 4 min/g Ar sputtering.
c) The sample for studying the effect of the amount of the comminuted material included the amounts of 30 g RP and 120 g RP. Each sample was prepared by plasma cleaning with $H_2$ plasma for 2.0 min/g, plasma treatment with Ar plasma for 2.0 min/g and a DLC coating deposition time of 8.0 min/g.

The foregoing description of the specific embodiments will so fully reveal the general nature of the embodiments herein that others may, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein may be practiced with modification within the spirit and scope of the appended claims.

What is claimed is:

1. A composition of matter comprising:
a solid pyrotechnic-composition fuel having a surface; and
a coating material coating at least a portion of the surface of the solid pyrotechnic-composition fuel, wherein the coating material comprises one or more networks selected from one or more rigid amorphous networks and one or more crystalline networks each comprising one or more of $sp^3$ and $sp^2$ hybridized carbon atoms.

2. The composition of matter according to claim 1, wherein the rigid amorphous networks and the crystalline networks are in a thermodynamically metastable phase.

3. The composition of matter according to claim 1, wherein the solid pyrotechnic-composition fuel is in comminuted form and comprises a plurality of particles, and wherein the coating material encapsulates each of the particles.

4. The composition of matter according to claim 3, wherein the coating material comprises a diamond-like carbon coating.

5. The composition of matter according to claim 3, wherein the solid pyrotechnic-composition fuel comprises one or more metals.

6. The composition of matter according to claim 5, wherein the metals comprise one or more of Mg, Al, and Fe.

7. The composition of matter according to claim 3, wherein the solid pyrotechnic-composition fuel comprises one or more metal hydrides.

8. The composition of matter according to claim 7, wherein the metal hydrides comprise one or more of $TiH_2$, $ZrH_2$, decaborane, and $AlH_3$.

9. The composition of matter according to claim 3, wherein the solid pyrotechnic-composition fuel comprises one or more non-metals.

10. The composition of matter according to claim 9, wherein the non-metals comprise one or more of red phosphorus (RP), Si, C, and S.

11. The composition of matter according to claim 3, wherein the solid pyrotechnic-composition fuel comprises one or more organic compositions.

12. The composition of matter according to claim 11, wherein the organic compositions comprise one or more of sugars, benzoates, salicylates, hexamine, anthracene, and naphthalene.

13. The composition of matter according to claim 3, wherein the solid pyrotechnic-composition fuel is red phosphorus (RP).

* * * * *